US012713773B2

(12) United States Patent
Hyun et al.

(10) Patent No.: US 12,713,773 B2
(45) Date of Patent: Aug. 18, 2026

(54) DISPLAY DEVICE

(71) Applicant: Samsung Display Co., LTD., Yongin-si (KR)

(72) Inventors: Jin Ho Hyun, Gwacheon-si (KR); Hee Chang Yoon, Anyang-si (KR); Hyoung Sub Lee, Yongin-si (KR); Hye Min Lee, Gimpo-si (KR); Oh June Kwon, Hwaseong-si (KR); Woo Yong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 907 days.

(21) Appl. No.: 17/851,949

(22) Filed: Jun. 28, 2022

(65) Prior Publication Data

US 2023/0008148 A1 Jan. 12, 2023

(30) Foreign Application Priority Data

Jul. 6, 2021 (KR) ........................ 10-2021-0088173

(51) Int. Cl.

| | |
|---|---|
| ***H10K 59/122*** | (2023.01) |
| ***G06F 3/041*** | (2006.01) |
| ***G06F 3/044*** | (2006.01) |
| ***H10K 59/121*** | (2023.01) |
| ***H10K 59/35*** | (2023.01) |
| ***H10K 59/38*** | (2023.01) |
| ***H10K 59/40*** | (2023.01) |

(52) U.S. Cl.

CPC ......... *H10K 59/122* (2023.02); *G06F 3/0412* (2013.01); *G06F 3/0446* (2019.05); *H10K 59/121* (2023.02); *H10K 59/353* (2023.02); *H10K 59/38* (2023.02); *H10K 59/40* (2023.02)

(58) Field of Classification Search

None

See application file for complete search history.

(56) References Cited

U.S. PATENT DOCUMENTS

| | | | |
|---|---|---|---|
| 11,048,352 B2 | 6/2021 | Kim et al. | |
| 11,158,686 B2 | 10/2021 | Lee et al. | |
| 11,723,254 B2 | 8/2023 | Lee et al. | |
| 2016/0254481 A1 | 9/2016 | Zeng et al. | |
| 2019/0103573 A1* | 4/2019 | Hamada | H10K 50/171 |

(Continued)

FOREIGN PATENT DOCUMENTS

| | | |
|---|---|---|
| CN | 112002736 A | 11/2020 |
| CN | 109192755 B | 12/2020 |
| KR | 10-2016-0028558 A | 3/2016 |

(Continued)

*Primary Examiner* — Brian M Butcher

(74) *Attorney, Agent, or Firm* — Womble Bond Dickinson (US) LLP

(57) ABSTRACT

A display device comprises a substrate; a first electrode on the substrate; a bank layer on the substrate and comprising an opening exposing the first electrode; a spacer on the bank layer and having a first thickness; a protrusion on the bank layer, spaced apart from the spacer, and having a second thickness smaller than the first thickness; and an emissive layer on the first electrode exposed by the bank layer, wherein the protrusion comprises a first protrusion pattern and a second protrusion pattern spaced apart from the first protrusion pattern with a valley hole therebetween.

20 Claims, 26 Drawing Sheets

(56) References Cited

U.S. PATENT DOCUMENTS

| | | | | |
|---|---|---|---|---|
| 2020/0144540 | A1* | 5/2020 | Lee | H10K 77/111 |
| 2023/0337503 | A1 | 10/2023 | Lee et al. | |

FOREIGN PATENT DOCUMENTS

| | | | |
|---|---|---|---|
| KR | 10-2019-0119697 | A | 10/2019 |
| KR | 2020-0001716 | A | 1/2020 |
| KR | 2020-0051150 | A | 5/2020 |
| KR | 10-2021-0028783 | A | 3/2021 |

* cited by examiner

10

PROTECT LAYER ~WDL
COLOR FILTER LAYER ~CFL
LIGHT-BLOCKING PATTERN LAYER ~BML
TOUCH LAYER ~TSL
ENCAPSULATION LAYER ~ENL
EMISSIVE LAYER ~EML
CIRCUIT-DRIVING LAYER ~DRL
SUBSTRATE ~SUB

DISPLAY DEVICE

CROSS-REFERENCE TO RELATED APPLICATION

The present application claims priority to and the benefit of Korean Patent Application No. 10-2021-0088173 filed on Jul. 6, 2021 in the Korean Intellectual Property Office, the entire disclosure of which is incorporated herein by reference.

BACKGROUND

1. Field

Aspects of some embodiments of the present disclosure relate to a display device.

2. Description of the Related Art

Electronic devices that display images to users such as smart phones, tablet PCs, digital cameras, laptop computers, navigation devices, and smart TVs include a display device for displaying images. Such display devices generally include display panels for generating and displaying images and various input means.

Recently, touch panels that recognize touch input from users have been employed for display devices of smart phones or tablet PCs. A touch panel determines (recognizes) whether a touch input is made, and, if any, finds the coordinates of the position of the touch input. The touch panel may include a plurality of sensing electrodes. The touch sensitivity may vary depending on the capacitance around the sensing electrodes.

The above information disclosed in this Background section is only for enhancement of understanding of the background and therefore the information discussed in this Background section does not necessarily constitute prior art.

SUMMARY

Aspects of some embodiments of the present disclosure relate to a display device, and for example, to a display device including a touch member.

Aspects of the present disclosure provide a display device in which an organic film of an encapsulation layer of a touch panel can spread more evenly.

Aspects of the present disclosure also provide a method of fabricating a display device in which an organic film of an encapsulation layer of a touch panel can spread more evenly.

According to some embodiments, a display device comprises a substrate; a first electrode on the substrate; a bank layer on the substrate and comprising an opening exposing the first electrode; a spacer on the bank layer and having a first thickness; a protrusion on the bank layer, spaced apart from the spacer, and having a second thickness smaller than the first thickness; and an emissive layer on the first electrode exposed by the bank layer, wherein the protrusion comprises a first protrusion pattern and a second protrusion pattern spaced apart from the first protrusion pattern with a valley hole therebetween.

According to some embodiments, a display device comprises a substrate; a first electrode on the substrate; a bank layer on the substrate and comprising an opening exposing the first electrode; a spacer on the bank layer and a protrusion spaced apart from the spacer; an emissive layer on the first electrode exposed by the bank layer; a second electrode on the emissive layer; and an encapsulation layer on the second electrode, wherein the protrusion comprises a first protrusion pattern having a first width, and a second protrusion pattern having a second width and spaced apart from the first protrusion pattern with a valley hole therebetween, wherein the encapsulation layer comprises a first inorganic film on the second electrode, an organic film on the first inorganic film, and a second inorganic film on the organic film, wherein the first protrusion pattern comprises a first upper surface, and a first side surface facing the second protrusion pattern, wherein the second protrusion pattern has a second width and comprises a second upper surface, and a second side surface facing the first protrusion pattern, wherein each of the second electrode and the first inorganic film covers the first upper surface, the first side surface, the second upper surface and the second side surface, wherein the valley hole is filled with the organic film, wherein the valley hole has a third width, and wherein the first width and the second width are greater than the third width.

According to some embodiments, a display device comprises a substrate; a first electrode on the substrate; a bank layer on the substrate and comprising an opening exposing the first electrode; a protrusion on the bank layer having a first thickness; and an emissive layer on the first electrode exposed by the bank layer, wherein the protrusion comprises a first protrusion pattern and a second protrusion pattern spaced apart from the first protrusion pattern with a valley hole therebetween, wherein the first protrusion pattern and the second protrusion pattern each have a first width when viewed from top (e.g., in a plan view), and the valley hole has a second width when viewed from the top (e.g., in the plan view), wherein the second width is smaller than the first width, and wherein the first thickness is equal to or less than 1.2 μm.

It should be noted that objects of the present disclosure are not limited to the above-mentioned object; and other objects of the present disclosure will be apparent to those skilled in the art from the following descriptions.

According to some embodiments of the present disclosure, an organic film of an encapsulation layer of a touch panel can spread more evenly in a display device.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in more detail aspects of some embodiments thereof with reference to the attached drawings, in which.

DETAILED DESCRIPTION

Figure 1:
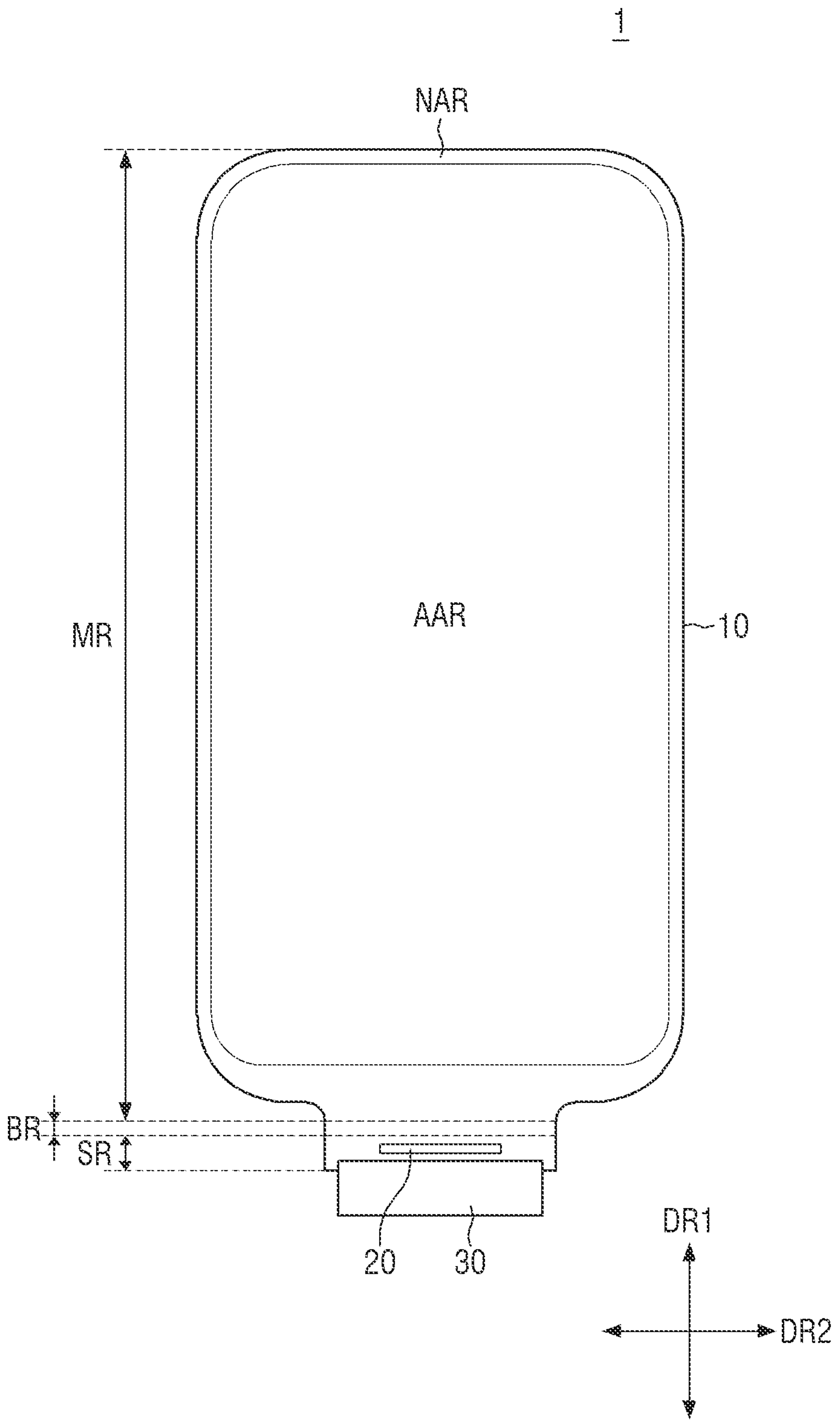
FIG. 1 is a plan view showing the layout of a display device according to some embodiments of the present disclosure.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Aspects of some embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, aspects of some embodiments of the present disclosure will be described in more detail with reference to the accompanying drawings.

Figure 2:
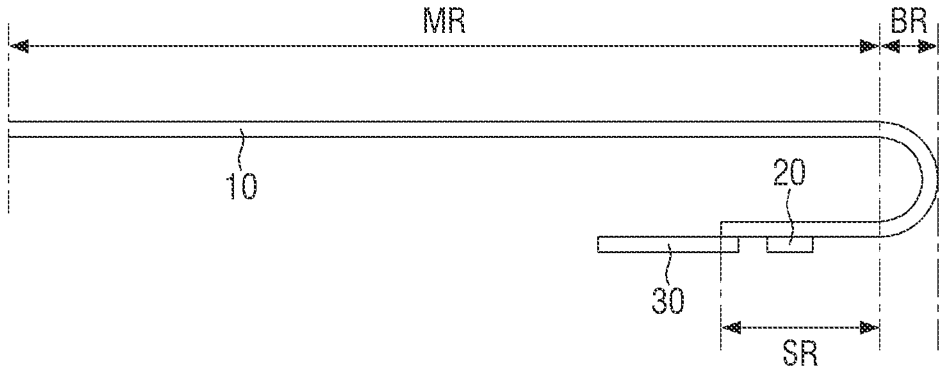
FIG. 2 is a cross-sectional view of a part of a display device according to some embodiments of the present disclosure.

FIG. 1 is a plan view showing the layout of a display device according to some embodiments of the present disclosure. FIG. 2 is a cross-sectional view of a part of a display device according to some embodiments of the present disclosure.

According to some embodiments, a first direction D1 and a second direction D2 are different directions and they may intersect each other. In the plan view of FIG. 1, the first direction DR1 is defined as the vertical direction and the second direction DR2 is defined as the horizontal direction for convenience of illustration. In the following description, a first side of the first direction DR1 indicates the upper side, a second side of the first direction DR1 indicates the lower side, a first side of the second direction DR2 indicates the right side, and a second side of the second direction DR2 indicates the left side when viewed from the top (e.g., in a plan view, or a direction perpendicular or normal with respect to a plane of the display surface). It should be understood that the directions referred to in the example embodiments are relative directions, and the embodiments are not limited to the directions mentioned.

Referring to FIGS. 1 and 2, a display device 1 may refer to any electronic device providing a display screen. The display device 1 may include portable electronic devices for providing a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, an Internet of Things device, etc., or any other suitable portable electronic device that includes a display screen.

The display device 1 includes an active area AAR and a non-active area NAR. In the display device 1, a display area may be defined as the area where images are display, a non-display area may be defined as the area where images are not displayed (e.g., a bezel area or an area in a periphery or outside a footprint of the display area), and a touch area may be defined as the area where a touch input is sensed. Then, the display area and the touch area may be included in the active area AAR. The display area and the touch area may overlap each other. That is to say, in the active area AAR, images are displayed and a touch input is sensed as well.

The shape of the active area AAR may be, for example, a rectangle or a rectangular shape with rounded corners. In the example shown, the shape of the active area AAR is a rectangle that has rounded corners and has its sides in the first direction DR1 longer than its sides in the second direction DR2. It is, however, to be understood that embodiments according to the present disclosure are not limited thereto. The active area AAR may have various shapes such as a rectangular shape with its sides in the second direction DR2 longer than its sides in the first direction DR1, a square shape, other polygonal shapes, a circular shape, and an elliptical shape.

The non-active area NAR is located around (e.g., in a periphery or outside a footprint of) the active area AAR. The non-active area NAR may be a bezel area. The non-active area NAR may surround all sides (four sides in the drawings) of the active area AAR. It is, however, to be understood that embodiments according to the present disclosure are not limited thereto. For example, the non-active area NAR may not be located near the upper side of the active area AAR or near the left or right side thereof.

According to some embodiments, signal lines for applying signals to the active area AAR or driving circuits may be located in the non-active area NAR. The non-active area NAR may include no display area. Further, the non-active area NAR may include no touch area. According to some embodiments, the non-active area NAR may include a part or portion of the touch area, and a sensor member such as a pressure sensor may be located in that part. According to some embodiments, the active area AAR may be completely identical to the display area where images are displayed, while the non-active area NAR may be completely identical to the non-display area where no image is displayed.

The display device 1 includes a display panel 10 for providing a display screen. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc. In the following description, an organic light-emitting display panel is employed as an example of the display panel 10, but embodiments according to the present disclosure are not limited thereto. Any other display panel may be employed as long as the technical idea of the present disclosure can be equally applied.

The display panel 10 may include a plurality of pixels. The plurality of pixels may be arranged in a matrix. The shape of each pixel may be, but is not limited to, a rectangle or a square when viewed from the top. Each pixel may have a diamond shape having sides inclined with respect to the first direction DR1. Each pixel may include an emission area. Each emission area may have the same shape as or a different shape from the shape of the pixels. For example, when the pixels have a rectangular shape, the shape of the emission area of each of the pixels may have various shapes such as a rectangle, a diamond, a hexagon, an octagon, and a circle. The pixels and the emission areas will be described in detail later.

The display device 1 may further include a touch member for sensing a touch input. The touch member may be implemented as a panel or film separated from the display panel 10 to be attached on the display panel 10 or may be implemented in the form of a touch layer inside the display panel 10. Although the touch member is provided inside the display panel to be included in the display panel 10 in the following description, it is to be understood that embodiments according to the present disclosure are not limited thereto.

The display panel 10 may include a flexible substrate including a flexible polymer material such as polyimide. Accordingly, the display panel 10 may be curved, bent, folded, or rolled.

The display panel 10 may include a bending region BR. The display panel 10 may be divided into a main region MR located on one side of the bending region BR and a subsidiary region SR located on the other side of the bending region BR.

The display area of the display panel 10 is located in the main region MR. According to some embodiments of the present disclosure, the edge portions of the display area in the main region MR, the entire bending region BR and the entire subsidiary region SR may be the non-display area. It is, however, to be understood that embodiments according to the present disclosure are not limited thereto. The bending region BR and/or the subsidiary region SR may also include the display area.

The bending region BR is connected to one side of the main region MR in the first direction DR1. For example, the bending region BR may be connected to the lower shorter side of the main region MR. The width of the bending region BR may be less than the width (width of the shorter side) of the main region MR. The portions where the main region MR meets the bending region BR may be cut in an L-shape when viewed from the top.

In the bending region BR, the display panel 10 may be bent downward in the thickness direction, for example, in the direction away from the display surface. Although the bending region BR may have a constant radius of curvature, embodiments according to the present disclosure are not limited thereto. It may have different radii of curvature for difference sections. As the display panel 10 is bent at the bending region BR, the surface of the display panel 10 may be reversed. For example, the surface of the display panel 10 facing upward may be bent such that it faces outward at the bending region BR and then faces downward.

The subsidiary region SR is extended from the bending region BR. The subsidiary region SR may be extended in a direction parallel to the main region MR from the end of the bending region. The subsidiary region SR may overlap with the main region MR in the thickness direction of the display panel 10. The width of the subsidiary region SR (the width in the second direction DR2) may be, but is not limited to being, equal to the width of the bending region BR.

A driver chip IC may be located in the subsidiary region SR. The driving chip IC may include an integrated circuit for driving the display panel 10. The integrated circuit may include an integrated circuit for display and/or an integrated circuit for a touch unit. The integrated circuit for a display and the integrated circuit for a touch unit may be provided as separate chips or may be integrated into a single chip.

A pad area may be located at the end of the subsidiary region SR of the display panel 10. The pad area may include display signal line pads and touch signal line pads. A drive circuit board FPC may be connected to the pad area at the end of the subsidiary region SR of the display panel 10. The drive circuit board FPC may be a flexible printed circuit board or a film.

Figure 3:
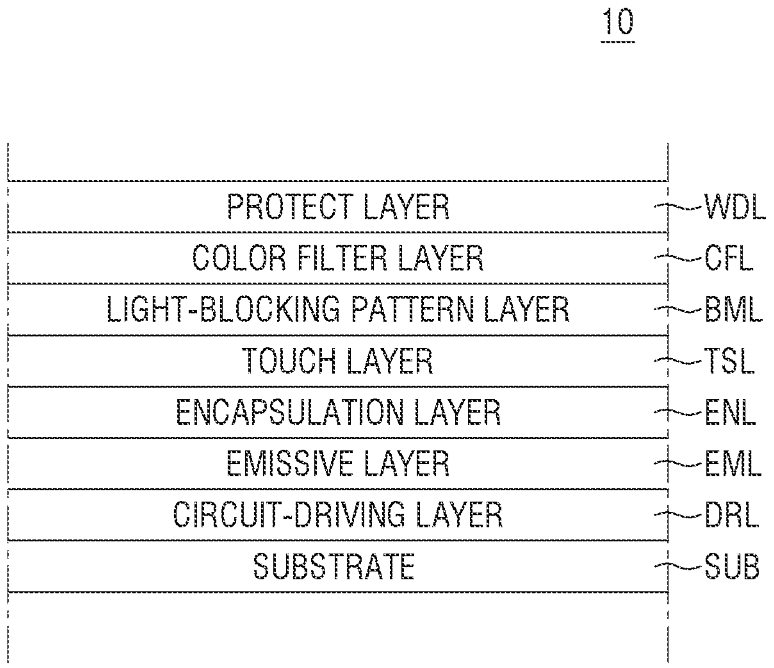
FIG. 3 is a cross-sectional view showing an example of a stack structure of a display panel according to some embodiments of the present disclosure.

FIG. 3 is a cross-sectional view showing an example of a stack structure of a display panel according to some embodiments of the present disclosure.

Referring to FIG. 3, the display panel 10 may include a circuit-driving layer DRL located on a substrate SUB. The circuit-driving layer DRL may include a circuit for driving an emissive layer EML of each pixel. The circuit-driving layer DRL may include a plurality of thin-film transistors.

The emissive layer EML may be located on the circuit-driving layer DRL. The emissive layer EML may include an organic emitting layer. The emissive layer EML may emit light with various luminances depending on driving signals transmitted from the circuit-driving layer DRL.

The encapsulation layer ENL may be located on the emissive layer EML. The encapsulation layer ENL may include an inorganic film or a stack of an inorganic film and an organic film. As another example, glass or an encapsulation film may be employed as the encapsulation layer ENL.

A touch layer TSL (a touch panel or a touch member) may be located on the encapsulation layer ENL. The touch layer TSL may sense a touch input and may perform the functions of the touch member. The touch layer TSL may include a plurality of sensing regions and sensing electrodes.

A light-blocking pattern layer BML may be located on the touch layer TSL. The light-blocking pattern layer BML can suppress reflection of external light and may improve the color of the reflected light.

A color filter layer CFL may be located on the light-blocking pattern layer BML. The color filter layer CFL can reduce the reflection of external light. The color filter layer CFL may include a red color filter, a green color filter, and a blue color filter. The color filters may be formed or arranged in the pixels, respectively. The color filters located in the pixels can improve color purity of lights emitted from the emission areas of the respective pixels. Although the color filter layer CFL and the light-blocking pattern layer BML are separate layers in the example shown in FIG. 3, embodiments according to the present disclosure are not limited thereto. The light-blocking pattern layer BML may be included in the color filter layer CFL in some implementations. For example, the light-blocking pattern layer BML may include light-blocking patterns located between the adjacent color filters, and the color filter layer CFL may include the light-blocking patterns.

According to some embodiments of the present disclosure, the color filter layer CFL is located on the light-blocking pattern layer BML to reduce the reflection of external light in the display device 1, and the transmittance of the light emitted from the emissive layer EML can be improved at the front compared to a display device in which a polarizing member is located on the light-blocking pattern layer BML.

A protection layer WDL may be located on the color filter layer CFL. The protection layer WDL may include, for example, a window member. The protection layer WDL may be attached on the color filter layer CFL by an optically clear adhesive or the like.

Hereinafter, the touch member will be described in more detail.

Figure 4:
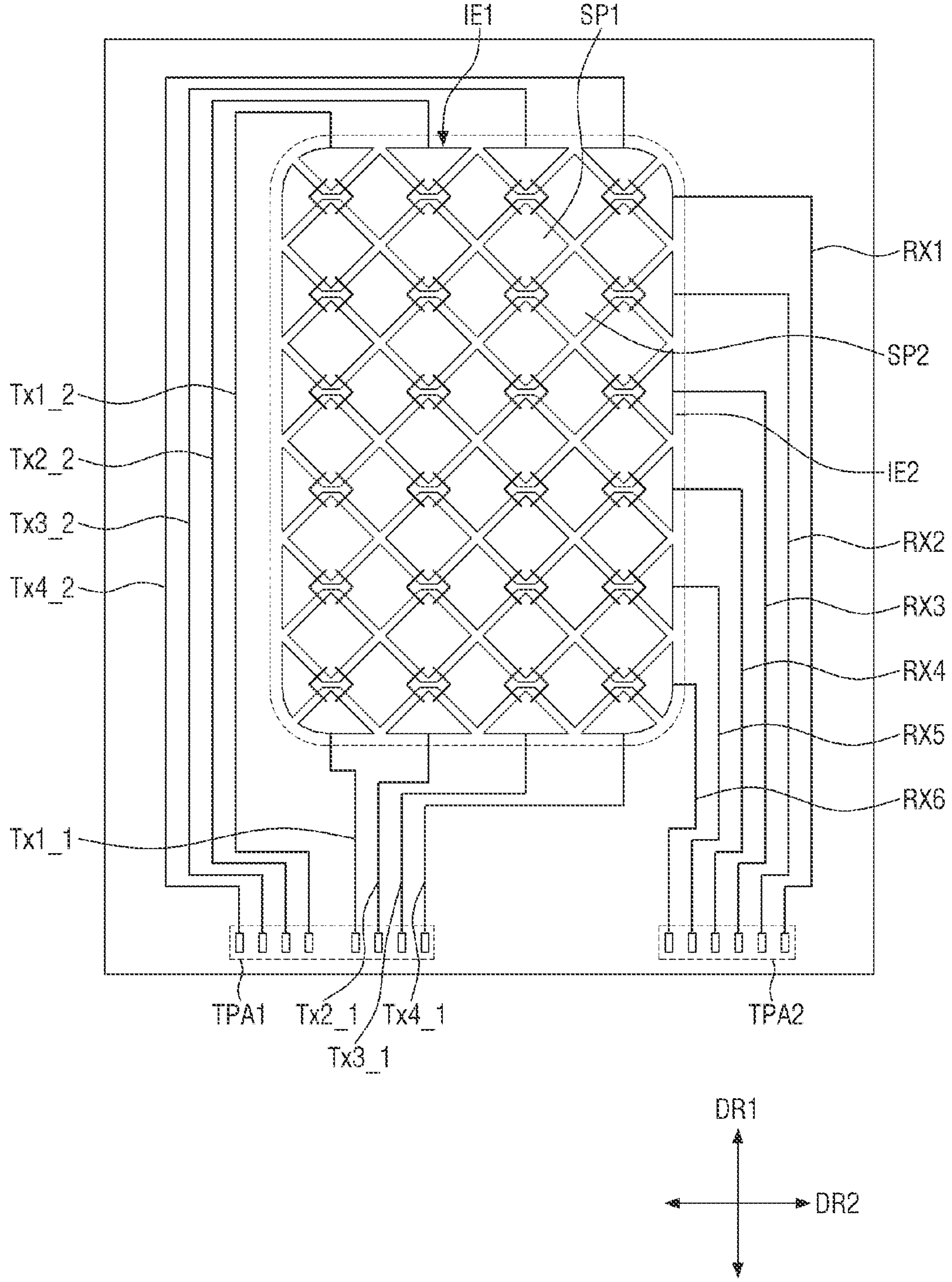
FIG. 4 is a schematic plan view of a touch member according to some embodiments of the present disclosure.

FIG. 4 is a schematic plan view of a touch member according to some embodiments of the present disclosure.

Referring to FIG. 4, the touch member may include a touch region located in the active area AAR and a non-touch region located in the non-active area NAR. Although the touch member is simplified while the non-touch region is exaggerated in FIG. 4 for convenience of illustration, the shapes of the touch region and the shape of the non-touch region may be substantially identical to those of the active area AAR and the non-active area NAR described above.

The touch region of the touch member may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. According to some embodiments, the first sensing electrodes IE1 are driving electrodes while the second sensing electrodes IE2 are sensing electrodes.

The first sensing electrodes IE1 may be extended in the first direction DR1. The first sensing electrodes IE1 may include a plurality of first sensor portions SP1 arranged in the first direction DR1 and the first connecting portions CP1 electrically connecting between adjacent ones of the first sensor portions SP1.

The plurality of first sensing electrodes IE1 may be arranged in the second direction DR2.

The second sensing electrodes IE2 may be extended in the second direction DR2. The second sensing electrodes IE2 may include a plurality of second sensor portions SP2 arranged in the second direction DR2 and the second connecting portions CP2 electrically connecting between adjacent ones of the second sensor portions SP2. The plurality of second sensing electrodes IE2 may be arranged in the first direction DR1.

Although the four first sensing electrodes IE1 and the six second sensing electrodes IE2 are arranged in the drawing, it is to be understood that the numbers of the first sensing electrodes IE1 and the second sensing electrodes IE2 are not limited to the above numerical values, and embodiments according to the present disclosure may include any suitable number of first and second sensing electrodes IE1 and IE2.

At least some of the first sensor portions SP1 and the second sensor portions SP2 may have a diamond shape. Some of the first sensor portions SP1 and the second sensor portions SP2 may have a truncated diamond shape. For example, all of the first sensor portions SP1 and the second parts SP2 except the first and last ones in the extension direction may have a diamond shape, and each of the first and last ones in the extension direction may have a triangle shape obtained by cutting the diamond shape. The first sensor portions SP1 and the second sensor portions SP2 in the diamond shape may have substantially the same size and shape. The first sensor portions SP1 and the second sensor portions SP2 in the triangle shape may have substantially the same size and shape. It is, however, to be understood that embodiments according to the present disclosure are not limited thereto. The first sensor portions SP1 and the second sensor portions SP2 may have a variety of shapes and sizes.

Figure 5:
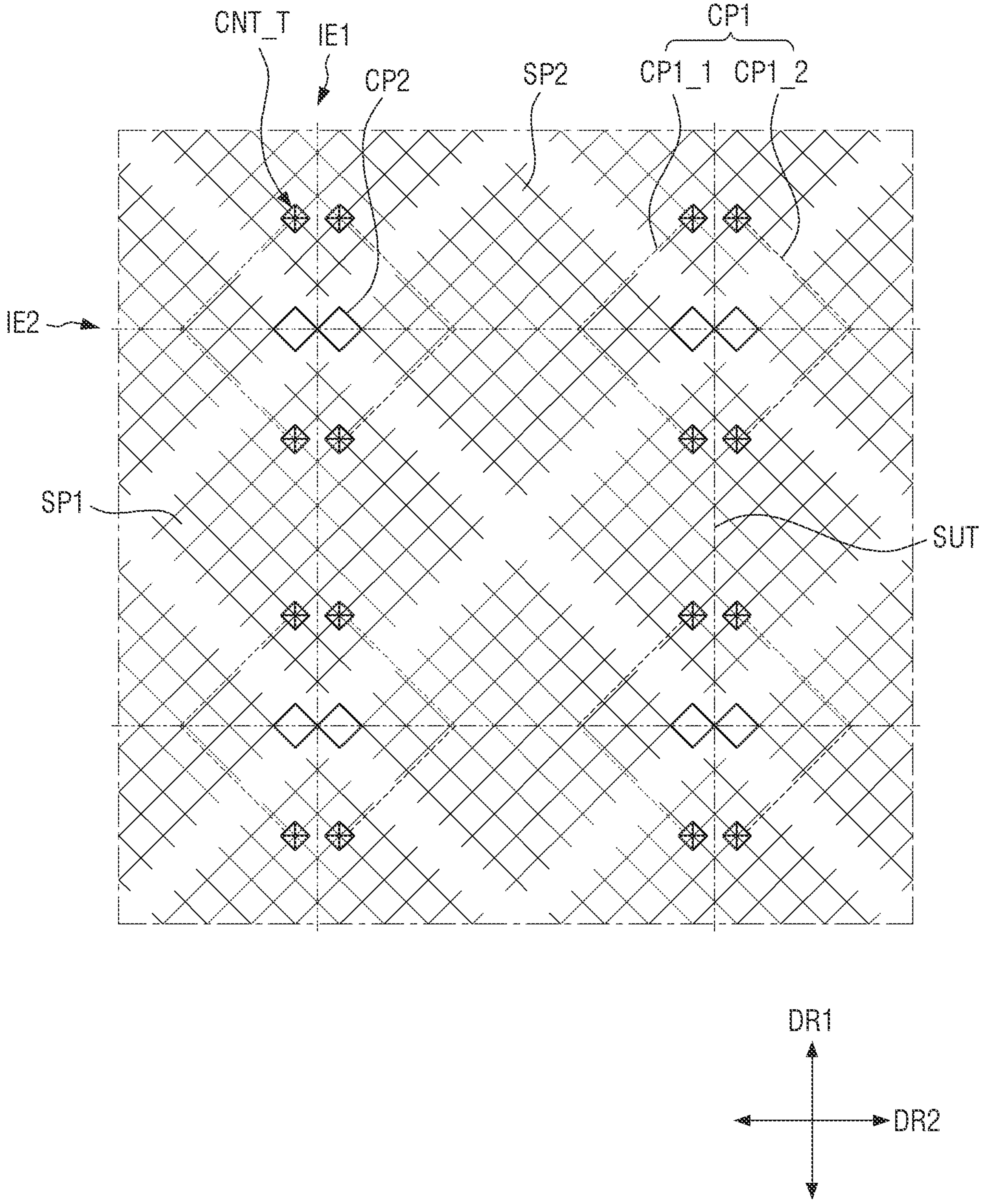
FIG. 5 is an enlarged view of a part of the touch region of FIG. 4.
Figure 7:
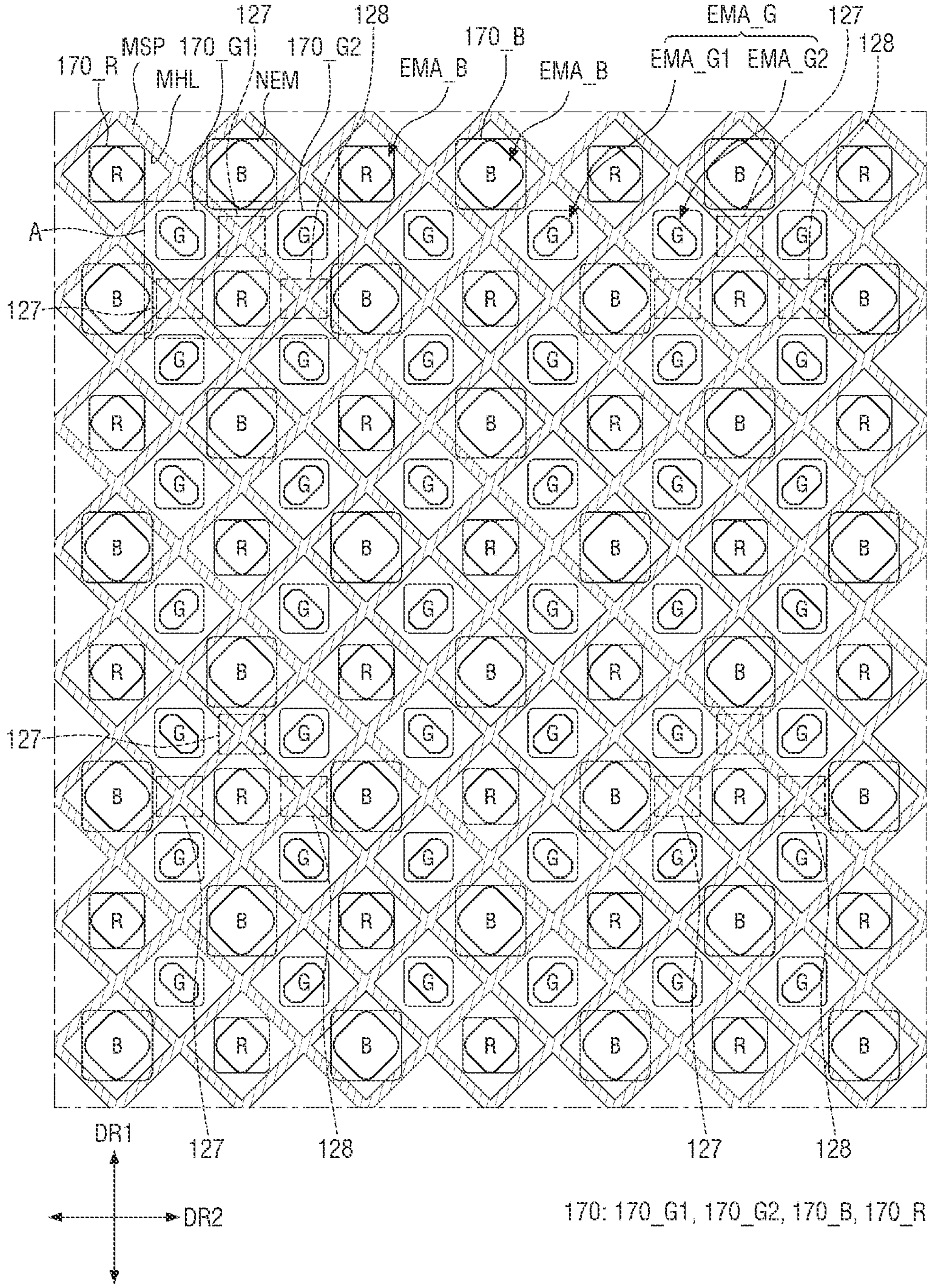
FIG. 7 is a diagram showing the relative arrangement relationship between the pixels and the touch member in a mesh pattern in the display area according to some embodiments of the present disclosure.

The first sensor portions SP1 of the first sensing electrodes IE1 and the second sensor portions SP2 of the second sensing electrodes IE2 may each include a planar pattern or a mesh pattern. When the first sensor portions SP1 and the second sensor portions SP2 include a planar pattern, the first sensor portions SP1 and the second sensor portions SP2 may be formed as a transparent conductive layer. When the first sensor portions SP1 and the second sensor portions SP2 include a mesh pattern arranged along the non-emission areas as illustrated in FIGS. 5 and 7, it is possible to employ an opaque, low-resistance metal without interfering with the propagation of the emitted light. In the following description, the first sensor portions SP1 and the second sensor portions SP2 each include a mesh pattern. It is, however, to be understood that embodiments according to the present disclosure are not limited thereto.

Each of the first connecting portions CP1 may connect a vertex of the diamond or triangle shape of a first sensor portion SP1 with that of an adjacent first sensor portion SP1. Each of the second connecting portions CP2 may connect a vertex of the diamond or triangle shape of a second sensor portion SP2 with that of an adjacent second sensor portion SP2. The width of the first connecting portions CP1 and the second connecting portions CP2 may be smaller than the width of the first sensor portions SP1 and the second sensor portions SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer arranged on a different layer at the intersections, such that the first sensing electrodes IE1 can be insulated from the second sensing electrodes IE2. The first sensing electrodes IE1 can be connected to one another by the first connecting portions CP1 while the second sensing electrodes IE2 can be connected to one another by the second connecting portions CP2, so that they can be insulated from each other while intersecting each other. To do so, the first connecting portions CP1 and/or the second connecting portions CP2 may be located on a different layer from the first sensing electrode IE1 and the second sensing electrode IE2.

For example, the first sensor portions SP1 of the first sensing electrodes IE1 and the second sensor portions SP2 of the second sensing electrodes IE2 may be formed as a conductive layer located on the same layer, and the first sensor portions SP1 and the second sensor SP2 may neither intersect nor overlap with each other. The adjacent ones of the first sensor portions SP1 and second sensor portions SP2 may be physically separated from each other.

The second connecting portions CP2 may be formed as the same conductive layer as the second sensor portions SP2 and may connect the adjacent ones of the second sensor portions SP2. A first sensor portion SP1 of a first sensing electrode IE1 is physically separated from an adjacent sensor portion SP1 thereof with respect to the area where a second connecting portion CP2 passes. The first connecting portions CP1 connecting the first sensor portions SP1 with one another may be formed as a different conductive layer from the first sensor portions SP1 and may traverse the area of the second sensing electrodes IE2. Each of the first connecting portions CP1 may be electrically connected to the respective first sensor portions SP1 by a contact.

There may be more than one first connecting portions CP1. For example, although not limited thereto, each of the first connection parts CP1 may include a first connecting portion CP1_1 which overlaps an adjacent second sensing electrode IE2 on one side, and another first connecting portion CP1_2 which overlaps another adjacent second sensing electrode IE2 on the other side. As more than one first connecting portions CP1 connect between two adjacent ones of the first sensor portions SP1, it is possible to prevent or reduce disconnection of the first sensing electrodes IE1 even if any of the first connecting portions CP1 is broken by static electricity or the like.

The first sensor portions SP1 and the second sensor portions SP2 adjacent to each other may form a unit sensing area SUT (see FIG. 5). For example, halves of two adjacent first sensor portions SP1 and halves of two adjacent second sensor portions SP2 may form a square or a rectangle, with respect to the intersection between the first sensing electrodes IE1 and the second sensing electrodes IE2. The area defined by the halves of the adjacent two first sensor portions SP1 and halves of the two adjacent second sensor portions SP2 may be a unit sensing area SUT. A plurality of unit sensing areas SUT may be arranged in row and column directions.

In each of the unit sensing areas SUT, the capacitance value between the adjacent first sensor portions SP1 and the second sensor portions SP2 is measured to determine whether or not a touch input is made, and if so, the position may be obtained as touch input coordinates. For example, a touch may be sensed by, for example, measuring mutual capacitance. In the following description, it is assumed that a touch is sensed by the mutual capacitive sensing. The touch sensitivity by the touch sensing in the unit sensing area SUT may be proportional to the measured capacitance between the first sensor portion SP1 and the second sensor portion SP2 adjacent to each other in the unit sensing area SUT and may be inversely proportional to the capacitance between the first sensor portion SP1 and the second sensor portion SP2 and the conductive layers located under the second touch conductive layer 220 (see, e.g., FIG. 6) in the unit sensing area SUT. The capacitance between the first sensor portion SP1 and the second sensor portion SP2 and the conductive layers located under the second touch conductive layer 220 (see, e.g., FIG. 6) in the unit sensing area SUT may be a noise signal level of the touch sensitivity. The capacitance between the first sensor portion SP1 and the second sensor portion SP2 and the conductive layers located under the second touch conductive layer 220 (see, e.g., FIG. 6) in the unit sensing area SUT may also be referred to as a base capacitance. In order to increase the touch sensitivity by the touch sensing in the unit sensing area SUT, it may be contemplated to reduce the noise signal level of the touch sensitivity, rather than the measured capacitance between the adjacent first sensor portion SP1 and second sensor portion SP2 in the unit sensing area SUT which has a constant value. A more detailed description thereon will be given later.

Each unit sensing area SUT may be larger than the size of a pixel. For example, each unit sensing area SUT may have an area equal to the area occupied by a plurality of pixels. The length of a side of the unit sensing area SUT may be in the range of, but is not limited to, 4 to 5 mm.

A plurality of touch signal lines is located in the non-active area NAR outside the touch region. The touch signal lines may be extended from the touch pad units TPA1 and TPA2 located in the subsidiary region SR to the non-active area NAR of the main region MR through the bending region BR.

The touch signal lines include touch driving lines TX and touch sensing lines RX.

The touch driving lines TX are connected to the first sensing electrodes IE1. According to some embodiments, a plurality of touch driving lines may be connected to a single first sensing electrode IE1. For example, the touch driving lines may include first touch driving lines TX1_1, TX2_1, TX3_1 and TX4_1 connected to the lower end of the first sensing electrodes IE1, and second touch driving lines TX1_2, TX2_2, TX3_2 and TX4_2 connected to the upper end of the first sensing electrodes IE1. The first touch driving lines TX1_1, TX2_1, TX3_1 and TX4_1 may be extended from touch signal line pads TPA1 as indicated by the upper arrow in the first direction DR1 and may be connected to the lower end of the first sensing electrodes IE1. The second touch driving lines TX1_2, TX2_2, TX3_2 and TX4_2 may be extended from the touch signal line pads TPA1 as indicated by the upper arrow in the first direction DR1 and may go along the left edge of the touch region to be connected to the upper end of the first sensing electrodes IE1.

The touch sensing lines RX are connected to the second sensing electrodes IE2. According to some embodiments, a single touch sensing line RX may be connected to a single second sensing electrode IE2. The touch sensing lines RX1, RX2, RX3, RX4, RX5 and RX6 may be extended from touch signal line pads TPA2 as indicated by the upper arrow in the first direction DR1 and may go along the right edge of the touch region to be connected to the right end of the second sensing electrodes IE2.

Figure 6:
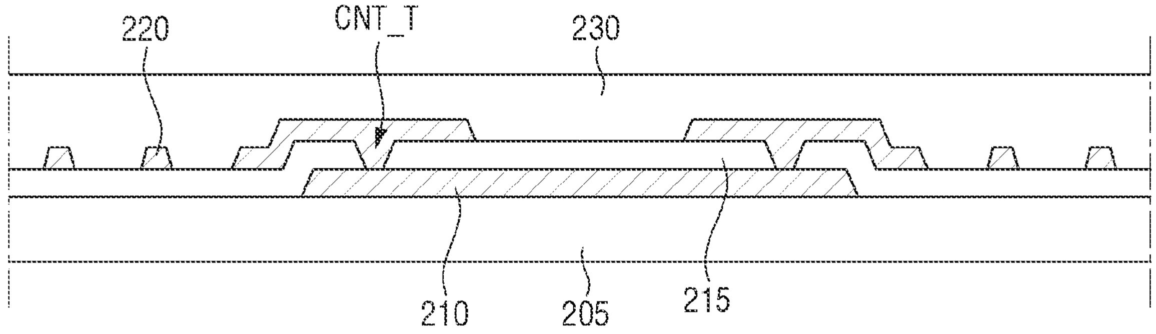
FIG. 6 is a cross-sectional view of a region including a contact hole between the first touch conductive layer and the second touch conductive layer of FIG. 5.

FIG. 5 is an enlarged view of a part of the touch region of FIG. 4. FIG. 6 is a cross-sectional view of a region including a contact hole between the first touch conductive layer and the second touch conductive layer of FIG. 5.

Referring to FIGS. 4 to 6, the touch member may include a base layer 205, a first touch conductive layer 210 on the base layer 205, a first touch insulating layer 215 on the first touch conductive layer 210, a second touch conductive layer 220 on the first touch insulating layer 215 and a second touch insulating layer 230 covering the second touch conductive layer 220.

For example, the first touch conductive layer 210 may be located on the base layer 205. The first touch conductive layer 210 is covered by the first touch insulating layer 215. The first touch insulating layer 215 insulates the first touch conductive layer 210 from the second touch conductive layer 220. The second touch conductive layer 220 is located on the first touch insulating layer 215. The second touch insulating layer 230 covers and protects the second touch conductive layer 220.

The base layer 205 may include an inorganic insulating material. For example, the base layer 205 may include a silicon nitride layer, a silicon oxynitride layer, a silicon oxide layer, a titanium oxide layer, or an aluminum oxide layer. According to some embodiments, the base layer 205 may be replaced with a second inorganic layer 193 forming a thin encapsulation layer to be described later.

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include a transparent conductive oxide such as indium tin oxide (ITO), indium zinc oxide (IZO), zinc oxide (ZnO) and indium tin zinc oxide (ITZO), a conductive polymer such as PEDOT, metal nanowire, grahpene, etc. As described above, when the first touch conductive layer 210 and the second touch conductive layer 220 are arranged at the non-emission area, they do not interfere with the propagation of the emitted light even if they are an opaque, low-resistance metal.

The first touch conductive layer 210 and/or the second touch conductive layer 220 may include a multi-layered conductive layer. For example, the first touch conductive layer 210 and/or the second touch conductive layer 220 may have a three-layer structure of titanium/aluminum/titanium.

According to some embodiments, the first connecting portions CP1 may be formed as the first touch conductive layer 210 while the first sensor portions SP1, the second sensor portions SP2 and the second connecting portions CP2 may be formed as the second touch conductive layer 220. It is, however, to be understood that embodiments according to the present disclosure are not limited thereto. On the contrary, the first connecting portions CP1 may be formed as the second touch conductive layer 220 while the sensor portions SP1 and SP2 and the second connecting portions CP2 may be formed as the first touch conductive layer 210. The touch signal lines may be formed as either the first touch conductive layer 210 or the second touch conductive layer 220. Alternatively, they may be formed as the first touch conductive layer 210 and the second touch conductive layer 220 connected by a contact. Besides, the touch conductive layers forming the elements of the sensing electrodes and the signal lines may be modified in a variety of ways.

The first touch insulating layer 215 and the second touch insulating layer 230 may include an inorganic material or an organic material. According to some embodiments, the first touch insulating layer 215 or the second touch insulating layer 230 may include an inorganic material and the other may include an organic material. According to some embodiments of the present disclosure, the first touch insulating layer 215 may include a silicon nitride layer, a silicon oxynitride layer, a silicon oxide layer, a titanium oxide layer, or an aluminum oxide layer. The second touch insulating layer 230 may include at least one of an acrylic resin, a methacrylic resin, a polyisoprene, a vinyl resin, an epoxy resin, a urethane resin, a cellulose resin, a siloxane resin, a polyimide resin, a polyamide resin, or a phenolic resin.

The first touch insulating layer 215 may include a contact hole CNT_T. The first touch conductive layer 210 (e.g., the first connecting portion CP1) and a part of the second touch conductive layer 220 (e.g., the first sensor portion SP1) may be electrically to each other through the contact hole CNT_T.

Figure 8:
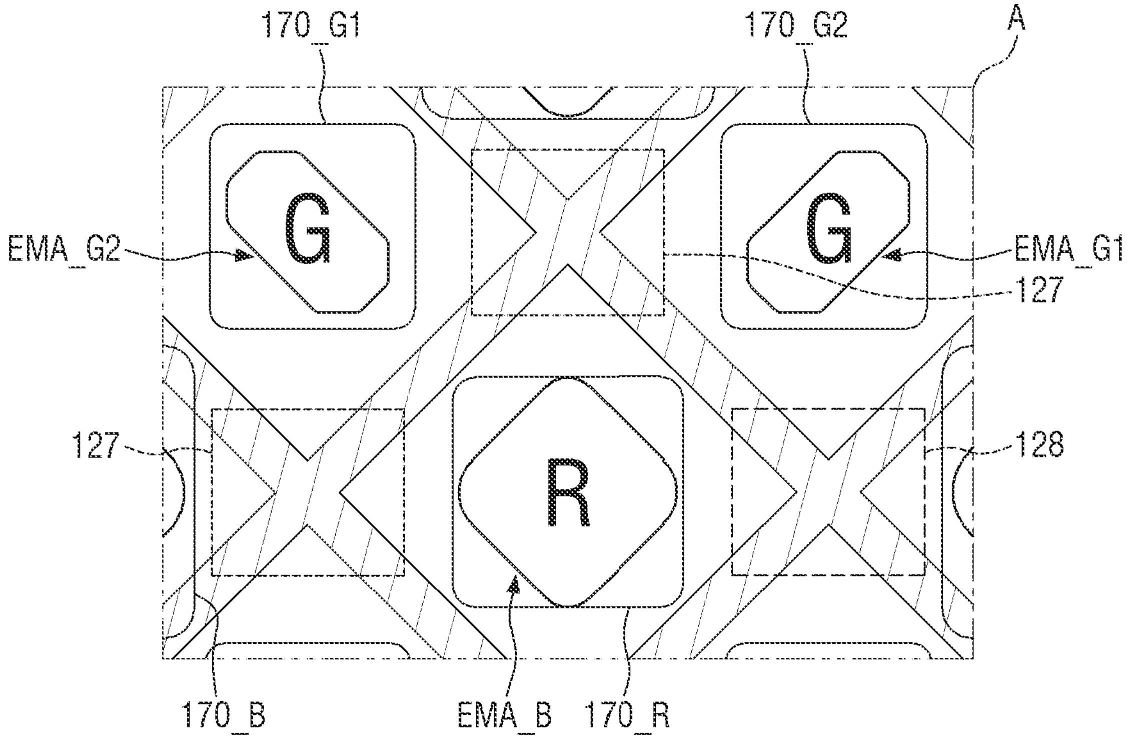
FIG. 8 is an enlarged plan view of area A of FIG. 7.

FIG. 7 is a diagram showing the relative arrangement relationship between the pixels and the touch member in a mesh pattern in the display area according to some embodiments of the present disclosure. FIG. 8 is an enlarged plan view of area A of FIG. 7.

Referring to FIGS. 7 and 8, the display area of the active area AAR includes a plurality of pixels. The pixels include emission areas EMA_R, EMA_B and EMA_G. As shown in FIGS. 7 and 8, anode electrodes 170: 170_R, 170_B, 170_G1 and 170_G2 are located in the pixels, and the emission areas EMA_R, EMA_G and EMA_B may overlap with openings exposing the anode electrodes 170 of the bank layer 126 and may be defined by them. A non-emission area NEM is located between the emission areas EMA_R, EMA_B and EMA_G of the pixels. The non-emission area NEM may overlap with the bank layer 126 and may be defined thereby. The non-emission area NEM may surround the emission areas EMA_R, EMA_B and EMA_G. The non-emission area NEM has a lattice shape or a mesh shape arranged along the diagonal directions intersecting with the first direction DR1 and the second direction DR2 when viewed from the top. A mesh pattern MSP is located in the non-emission area NEM.

The pixels may include first color pixels (e.g., red pixels), second color pixels (e.g., blue pixels), and third color pixels (e.g., green pixels). The shape of the emission areas EMA_R, EMA_G and EMA_B of the color pixels may be generally an octagon, a square or a diamond with rounded corners. It is, however, to be understood that embodiments according to the present disclosure are not limited thereto. The shape of the emission areas EMA_R, EMA_G and EMA_B may be a circle, or other polygons with or without rounded corners.

According to some embodiments, the emission areas EMA_R of the first color pixels and the emission areas EMA_B of the second color pixels may have similar shapes such as a diamond shape with rounded corners. The emission areas EMA_B of the second color pixels may be larger than the emission areas EMA_R of the first color pixels.

The emission areas EMA_G of the third color pixels may be smaller than the emission areas EMA_R of the first color pixels. The emission area EMA_G of the third color pixel may have an octagon shape that is inclined in a diagonal direction and having the maximum width in the inclined direction. The emission areas EMA_G1 may be inclined in a first diagonal direction, and the emission areas EMA_G2 may be inclined in a second diagonal direction.

The emission areas EMA_R, EMA_G and EMA_B of the color pixels may be arranged in various ways. According to some embodiments, the emission areas EMA_R of the first color pixels and the emission areas EMA_B of the second color pixels may be alternately arranged in the second direction DR2 to form a first row, while the emission areas EMA_G: EMA_G1 and EMA_G2 of the third color pixels may be arranged in the second direction DR2 to form a second row next to the first row. The emission areas EMA_G: EMA_G1 and EMA_G2 of the third color pixels belonging to the second row may be arranged in a staggered manner in the second direction DR2 with respect to the emission areas EMA_R and EMA_B of the pixels belonging to the first row. In the second row, the emission areas EMA_G1 of the third color pixels that are inclined in the first diagonal direction and the emission areas EMA_G2 of the third color pixels that are inclined in the second diagonal direction may be alternately arranged in the second direction DR2.

In a third row, the emission areas EMA_R and EMA_B may be arranged in the same manner as that of the first row but may be arranged in the alternating order.

The arrangement of the first to fourth rows may be repeated in the first direction DR1. It is to be understood that the arrangement of the emission areas EMA_R, EMA_B and EMA_G is not limited to the above example.

The mesh pattern MSP may be arranged along the boundaries of the pixels in the non-emission area NEM. The mesh pattern MSP may not overlap with the emission areas EMA_R, EMA_G and EMA_B. The mesh pattern MSP may be located in the non-emission area NEM when viewed from the top. According to some embodiments, mesh holes MHL exposed by the mesh pattern MSP may have a substantially diamond shape. The mesh holes MHL may have the same size. Alternatively, the mesh holes MHL may have different sizes either depending on the size of the emission areas EMA_R, EMA_G and EMA_B exposed via the mesh holes MHL or regardless of it. Although a single mesh hole MHL is formed in each of the emission areas EMA_R, EMA_G and EMA_B in the drawing, this is merely illustrative. In some implementations, a single mesh hole MHL may be formed across two or more emission areas EMA_R, EMA_G and EMA_B.

Incidentally, a spacer 127 and a protrusion 128 spaced apart from the spacer 127 may be located in the non-emission area NEM. The spacer 127 and the protrusion 128 are located at the intersections of the portions extended in a first diagonal direction and the portions extended in a second diagonal direction of the non-emission area NEM (or the bank layer 126), respectively, and the spacer 127 and the protrusion 128 may be located at different intersections. That is to say, the spacer 127 and the protrusion 128 are located at the intersections of the non-emission area NEM in a mesh pattern, but may be located at different intersections, respectively.

The spacer 127 may be formed in an island shape when viewed from the top. Unlike that shown in the drawings, the spacer 127 and the protrusion 128 may be located at a variety of locations of the intersections of the non-emission area NEM in a mesh pattern.

Figure 9:
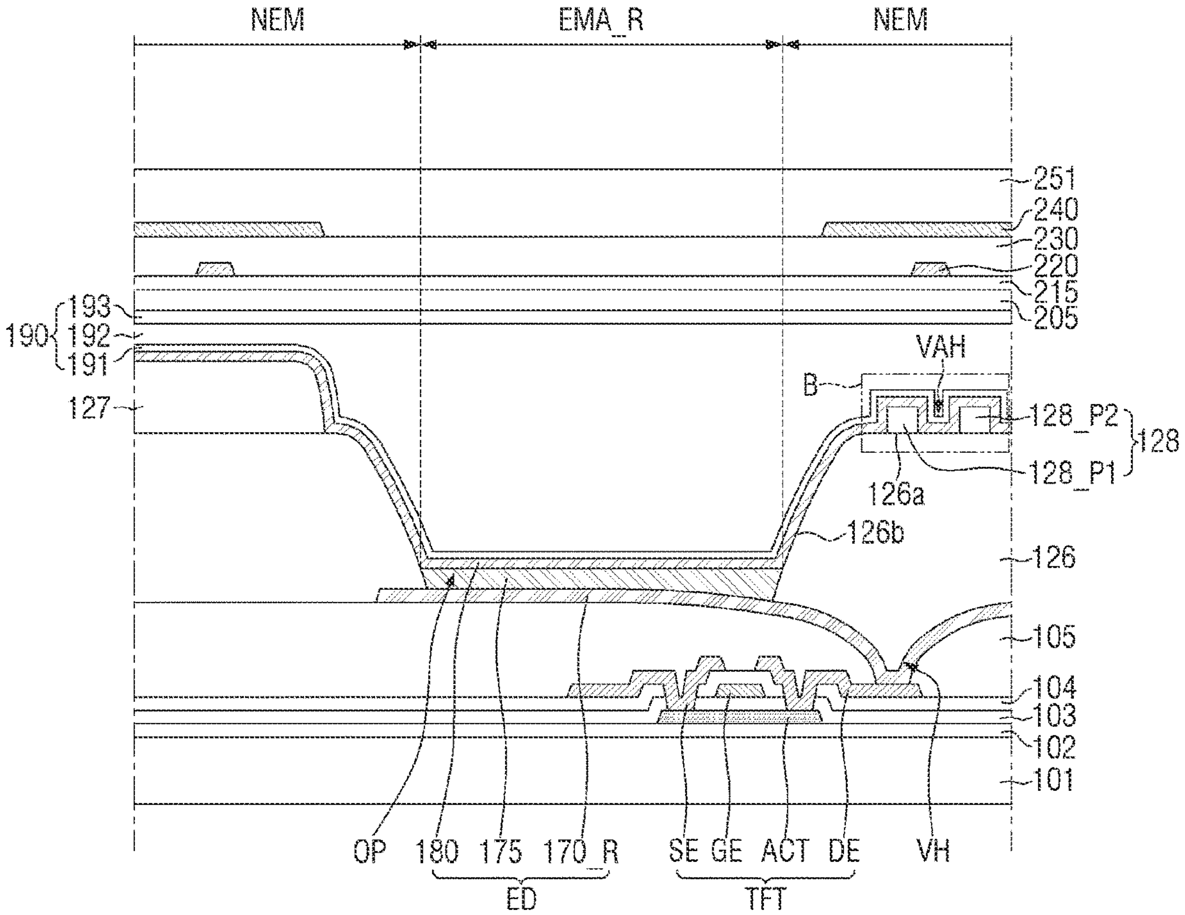
FIG. 9 is a cross-sectional view taken along an emission area, a spacer and a protrusion of a first color pixel of FIG. 8.
Figure 10:
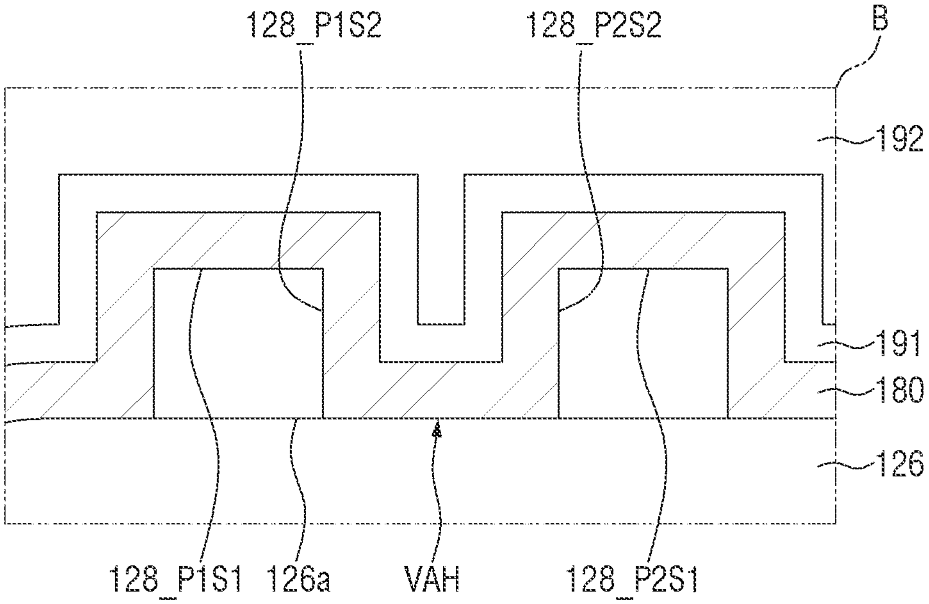
FIG. 10 is an enlarged cross-sectional view of area B of FIG. 9.
Figure 11:
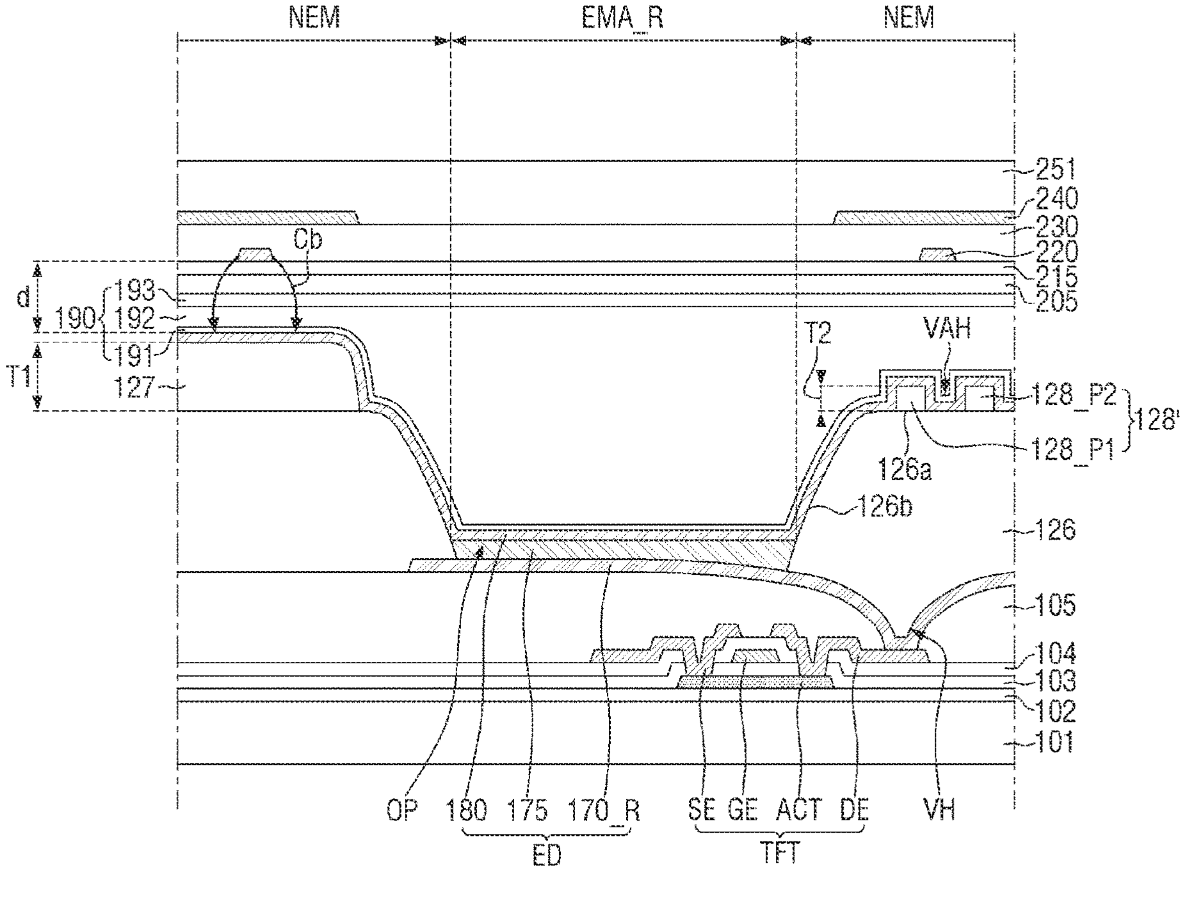
FIG. 11 is a diagram schematically showing parasitic capacitance of a display device according to some embodiments.

FIG. 9 is a cross-sectional view taken along an emission area, a spacer and a protrusion of a first color pixel of FIG. 8. FIG. 10 is an enlarged cross-sectional view of area B of FIG. 9. FIG. 11 is a diagram schematically showing parasitic capacitance of a display device according to some embodiments.

Referring to FIGS. 9 to 11, a substrate 101 of the display device 1 may be made of an insulating material such as a polymer resin Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 101 may be a flexible substrate that can be bent, folded, or rolled. An example of the material of the flexible substrate may be, but is not limited to, polyimide (PI).

A buffer layer 102 may be arranged on the substrate 101. The buffer layer 102 can prevent or reduce impurity ions from diffusing and can prevent or reduce permeation of moisture or outside air. The buffer layer 102 may include silicon nitride, silicon oxide, silicon oxynitride, or the like.

The semiconductor layer ACT may be located on the buffer layer 102. The semiconductor layer ACT forms a channel of the thin-film transistor TFT. The semiconductor layer ACT may include source/drain regions and an active region. The semiconductor layer ACT may include polycrystalline silicon. The polycrystalline silicon may be formed by crystallizing amorphous silicon. Examples of the crystallizing techniques may include, but is not limited to, rapid thermal annealing (RTA), solid phase crystallization (SPC), excimer laser annealing (ELA), metal induced crystallization (MIC), metal induced lateral crystallization (MILC), sequential lateral solidification (SLS), etc. The region of the semiconductor layer ACT which is connected to the source/drain electrodes of the thin-film transistors (i.e., source/drain region) may be doped with impurity ions (p-type impurity ions in case of PMOS transistors). Trivalent dopants such as boron (B) may be used as the p-type impurity ions. According to some embodiments, the semiconductor layer ACT may include monocrystalline silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. According to some embodiments of the present disclosure, the semiconductor layer ACT may include an oxide including indium, tin and titanium (ITZO) or an oxide including indium, gallium and tin (IGZO).

A gate insulating layer 103 may be located on the semiconductor layer ACT. The gate insulating layer 103 may be generally arranged over the entire surface of the substrate 101 including the display area DA and the non-display area NDA. The gate insulating layer 103 may be a gate insulating film having a gate insulating function. The gate insulator 103 may include a silicon compound, a metal oxide, etc. For example, the gate insulating layer 103 may include silicon oxide, silicon nitride, silicon oxynitride, aluminum oxide, tantalum oxide, hafnium oxide, zirconium oxide, titanium oxide, etc. They may be used alone or in combinations. Although the gate insulating layer 103 is made up of a single layer in the drawings, the gate insulating layer 103 may be made up of a stack of multiple films of different materials in some implementations.

A gate electrode GE is arranged on the gate insulating layer 103. According to some embodiments of the present disclosure, the gate electrode GE may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer dielectric layer 104 may be located on the gate electrode GE. The interlayer dielectric layer 104 may insulate a first gate conductive layer 110 from a second gate conductive layer 120. The interlayer dielectric layer 104 may include an inorganic insulating materials such as silicon oxide, silicon nitride, silicon oxynitride, hafnium oxide, aluminum oxide, titanium oxide, tantalum oxide and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin and benzocyclobutene (BCB). Although the interlayer dielectric layer 104 is made up of a single film in the drawings, the present disclosure is not limited thereto. The interlayer dielectric layer 104 may be made up of a stack of multiple films including different materials.

A source electrode SE and a drain electrode DE may be located on the interlayer dielectric layer 104. The source electrode SE and the drain electrode DE of the thin-film transistor TFT may be electrically connected to the source region and the drain region of the semiconductor layer ACT, respectively, through contact holes formed through the interlayer dielectric layer 104 and the gate insulating layer 103.

The source electrode SE and the drain electrode DE may include at least one metal selected from the group consisting of: aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu) and molybdenum (Mo). As shown in the drawings, the first source/drain conductive layer 130 may be made up of a single film. It is, however, to be understood that the present disclosure is not limited thereto. The first source/drain conductive layer 130 may be made up of multiple films. For example, the first source/drain conductive layer 130 may have a stack structure of Ti/Al/Ti, Mo/Al/Mo, Mo/AlGe/Mo, Ti/Cu, etc.

A via layer 105 may be located on the source and drain electrodes SE and DE. The via layer 105 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB). The via layer 105 may include a via hole VH exposing the upper surface of the drain electrode DE.

The anode electrodes 170 are arranged on the via layer 105. Because FIG. 9 includes a cross-sectional view of the emission area EMA_R of the first color pixel, only the anode electrode 170_R of the first color pixel is depicted among the anode electrodes 170. Hereinafter, although only the anode electrode 170_R of the first color pixel will be described, the description on the anode electrode 170_R of the first color pixel may be equally applied to the other anode electrodes 170_B, 170_G1 and 170_G2 unless specifically stated otherwise. The anode electrode 170_R may be electrically connected to the drain electrode DE through the via hole VH.

The anode electrode 170_R may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. The layer having a high work function may be arranged above the reflective material layer so that it is located closer to the organic layer 175. The anode electrode 170_R may have, but is not limited to, a multilayer structure of ITO/Mg, ITO/MgF, ITO/Ag, and ITO/Ag/ITO.

The bank layer 126 may be located on the via layer 105. The bank layer 126 may be located over the anode electrode 170_R and may include an opening OP exposing the anode electrode 170_R. The emission areas EMA_R, EMA_G and EMA_B and the non-emission area NEM may be separated by the bank layer 126 and the openings OP thereof. The bank layer 126 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The bank layer 126 may include an inorganic material.

The spacer 127 and the protrusion 128 spaced apart from the spacer 127 may be located on the bank layer 126. The spacer 127 may have a first thickness T1, and the protrusion 128 may have a second thickness T2 smaller than the first thickness T1. The protrusion 128 may include a first protrusion pattern 128_P1 and a second protrusion pattern 128_P2 spaced apart from the first protrusion pattern 128_P1. The space between the first protrusion pattern 128_P1 and the second protrusion pattern 128_P2 may include a valley hole VAH. In other words, the first protrusion pattern 128_P1 and the second protrusion pattern 128_P2 may be spaced apart from each other with the valley hole VAH therebetween. The spacer 127 may be located directly on the upper surface 126*a* of the bank layer 126, the protrusion 128 may be located directly on the upper surface 126*a* of the bank layer 126, and the valley hole VAH may expose the upper surface 126*a* of the bank layer 126.

An emissive layer is located on the anode electrode 170_R exposed via the bank layer 126. The emissive layer may include an organic layer 175. The organic layer 175 may include an organic emitting layer and may further include a hole injecting/transporting layer and/or an electron injecting/transporting layer.

A cathode electrode 180 may be located on the organic layer 175. The cathode electrode 180 may be a common electrode located across the pixels. The anode electrode 170_R, the organic layer 175 and the cathode electrode 180 may form an organic light-emitting diode ED of the first color pixel.

The cathode electrode 180 may be in contact with the organic layer 175 as well as the upper surface of the bank layer 126. The cathode electrode 180 may be formed conformally to the underlying features to reflect the level differences of the underlying features. As used herein, the phrase that a material is conformally deposited on a structure to form a film means that the film has a uniform thickness and thus reflects the level differences of the structure.

The cathode electrode 180 may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode 180 may further include a transparent metal oxide layer located on the material layer having a small work function.

A thin-film encapsulation layer 190 including a first inorganic layer 191, an organic film 192 and a second inorganic layer 193 is located on the cathode electrode 180. The thin-film encapsulation layer 190 may be located between the cathode electrode 180 and the base layer 205.

Each of the first inorganic film 191 and the second inorganic film 193 may include silicon nitride, silicon oxide, silicon oxynitride, or the like.

In order to increase the touch sensitivity by the touch sensing in the unit sensing area SUT, it may be contemplated to reduce the capacitance between the first sensor portion SP1 and the second sensor portion SP2 and the conductive layers located under the second touch conductive layer 220 (see FIG. 6) in the unit sensing area SUT. In particular, the first sensor portion SP1 and the second sensor portion SP2 as well as the cathode electrode 180 among the conductive layers located under the second touch conductive layer 220 which is closest to the second touch conductive layer 220 may have the greatest influence on the noise signal level of the touch sensitivity.

The capacitance Cb between the cathode electrode 180 and the second touch conductive layer 220 in the unit sensing area SUT (the first sensor portion SP1 and the second sensor portion SP2) may be inversely proportional to the distance d between the second touch conductive layer 220 and the cathode electrode 180 and may be proportional to the dielectric constant of the organic film 192. Therefore, in order to reduce the capacitance Cb between the cathode electrode 180 and the second touch conductive layer 220 in the unit sensing area SUT (the first sensor portion SP1 and the second sensor portion SP2), it may be contemplated to increase the distance d between the second touch conductive layer 220 and the cathode electrode 180 and to lower the dielectric constant of the organic film 192.

As described above with reference to FIG. 3, according to some embodiments of the present disclosure, the transmittance of light emitted from the emissive layer EML can be improved at the front by arranging the color filter layer CFL on the light-blocking pattern layer BML in the display device 1. However, when the distance d between the second touch conductive layer 220 and the cathode electrode 180 is increased, the transmittance of light emitted from the emissive layer EML at the front may be lowered.

In addition, as shown in FIG. 8, the inorganic films 191 and 193, the organic film 192, the base layer 205 and the first touch insulating layer 215 are located between the second touch conductive layer 220 and the cathode electrode 180. Among the inorganic films 191 and 193, the organic film 192, the base layer 205 and the first touch insulating layer 215, the thickness of the organic film 192 may be greatest.

Therefore, in order to reduce the capacitance Cb between the cathode electrode 180 and the second touch conductive layer 220 in the unit sensing area SUT (the first sensor portion SP1 and the second sensor portion SP2) without compromising the transmittance of the light emitted from the emissive layer EML at the front, it is desired to lower the dielectric constant of the organic film 192 as well as the thickness of the organic film 192.

According to some embodiments of the present disclosure, in order to reduce the capacitance Cb between the cathode electrode 180 and the second touch conductive layer 220 in the unit sensing area SUT (the first sensor portion SP1 and the second sensor portion SP2), the organic film 192 may have a dielectric constant approximately from 2.0 to 3.0. The organic film 192 contains organic molecules. Due to the characteristics of the organic film 192 containing the organic molecules, the dielectric constant of the organic film 192 may be equal to or greater than approximately 2.0. When the dielectric constant of the organic film 192 is equal to or less than approximately 3.0, it is possible to lower the capacitance value Cb between the cathode electrode 180 and the second touch conductive layer 220 (the first sensor portion SP1 and the second sensor portion SP2) in the unit sensing area SUT.

In order to adjust the thickness of the organic film 192 to improve the transmittance of light emitted from the emissive layer EML at the front, it may be contemplated to adjust the distance between nozzles for applying the organic material 192' (see FIG. 12) of the organic film 192. In other words, in order to reduce the thickness of the organic film 192, the distance between the nozzles for applying the organic material 192' may be widened. In doing so, however, the organic material 192' may not spread evenly. If the organic material 192' does not spread evenly, the uniformity of the organic film 192 may be deteriorated, possibly resulting in mura of the display device 1.

According to some embodiments of the present disclosure, by further forming protrusion 128 on the bank layer 126 which is spaced apart from the spacer 127 and including the valley hole VAH, the organic material 192' can spread more evenly.

The spacer 127 may serve to maintain a gap with elements located thereabove. For example, during a process of depositing an organic layer by using a fine metal mask (FMM), the spacer 127 can prevent or reduce sagging of the fine metal mask. After depositing the organic layer using the fine metal mask (FMM) and then removing the fine metal mask (FMM), some material on the upper surface of the spacer 127 in direct contact with the fine metal mask (FMM) may be attached to the fine metal mask (FMM) and removed together. If the thickness of the spacer 127 is equal to that of the protrusion 128, some materials of the upper surface of the protrusion 128 may be attached to the fine metal mask (FMM) and removed together. In contrast, according to some embodiments of the present disclosure, the second thickness T2 of the protrusion 128 is smaller than the first thickness T1 of the spacer 127, and thus it is possible to prevent or reduce some materials of the upper surface of the protrusion 128 from being attached to and removed together with the fine metal mask (FMM).

The first protrusion pattern 128_P1 may include a first upper surface 128_P1S1 and a first side surface 128_P1S2 facing the second protrusion pattern 128_P2. The second protrusion pattern 128_P2 may include a second upper surface 128_P2S1 and a second side surface 128_P2S2 facing the first protrusion pattern 128_P1. As described above, because the second electrode 180 is arranged conformally to the level differences thereunder, it completely may cover the first upper surface 128_P1S1, the first side surface 128_P1S2, the second upper surface 128_P2S1 and the second side surface 128_P2S2, and may conformally reflect the level differences created by the first protrusion pattern 128_P1 and the second protrusion pattern 128_P2.

Likewise, the first inorganic film 191 of the thin-film encapsulation layer 190 may completely cover the first upper surface 128_P1S1, the first side surface 128_P1S2, the second upper surface 128_P2S1 and the second side surface 128_P2S2, and may conformally reflect the level differences created by the first protrusion pattern 128_P1 and the second protrusion pattern 128_P2. The valley hole VAH may be filled with the organic film 192.

The base layer 205, the first touch insulating layer 215, the second touch conductive layer 220 and the second touch insulating layer 230 may be sequentially located on the thin-film encapsulation layer 190. The layers have been described above; and, therefore, some redundant description thereof may be omitted. FIGS. 9 and 11 are cross-sectional views of the sensor portion, and therefore, the first touch conductive layer 210 is not shown in the cross-sectional views.

The second touch conductive layer 220 may overlap with the bank layer 126 and may be located in the non-emission area NEM. The second touch conductive layer 220 forms the mesh pattern MSP of the sensor portions and does not interfere with emission of light and is not seen by a viewer because it does not overlap with the emission areas EMA_R, EMA_G and EMA_B.

A light-blocking pattern 240 is located on the second touch insulating layer 230. The light-blocking pattern layer 240 can suppress reflection of external light and can improve the color of the reflected light. The light-blocking pattern 240 is located in the non-emission area NEM. The light-blocking pattern 240 may have a lattice shape or a mesh shape when viewed from the top. The light-blocking pattern 240, the touch conductive layers 210 and 220 and the bank layer 126 are all located in the non-emission area NEM and overlap with one another in the thickness direction. The width of the light-blocking pattern 240 may be equal to or less than the width of the bank layer 126 and may be larger than the width of the touch conductive layers 210 and 220. The light-blocking pattern 240 may not overlap with the emission areas EMA_R, EMA_G and EMA_B.

An overcoat layer 251 is located on the light-blocking pattern 240. The overcoat layer 251 may be arranged directly over the light-blocking pattern 240. The overcoat layer 251 covers and protects the light-blocking pattern 240. According to some embodiments, the overcoat layer 251 may further provide a flat surface.

Figure 12:
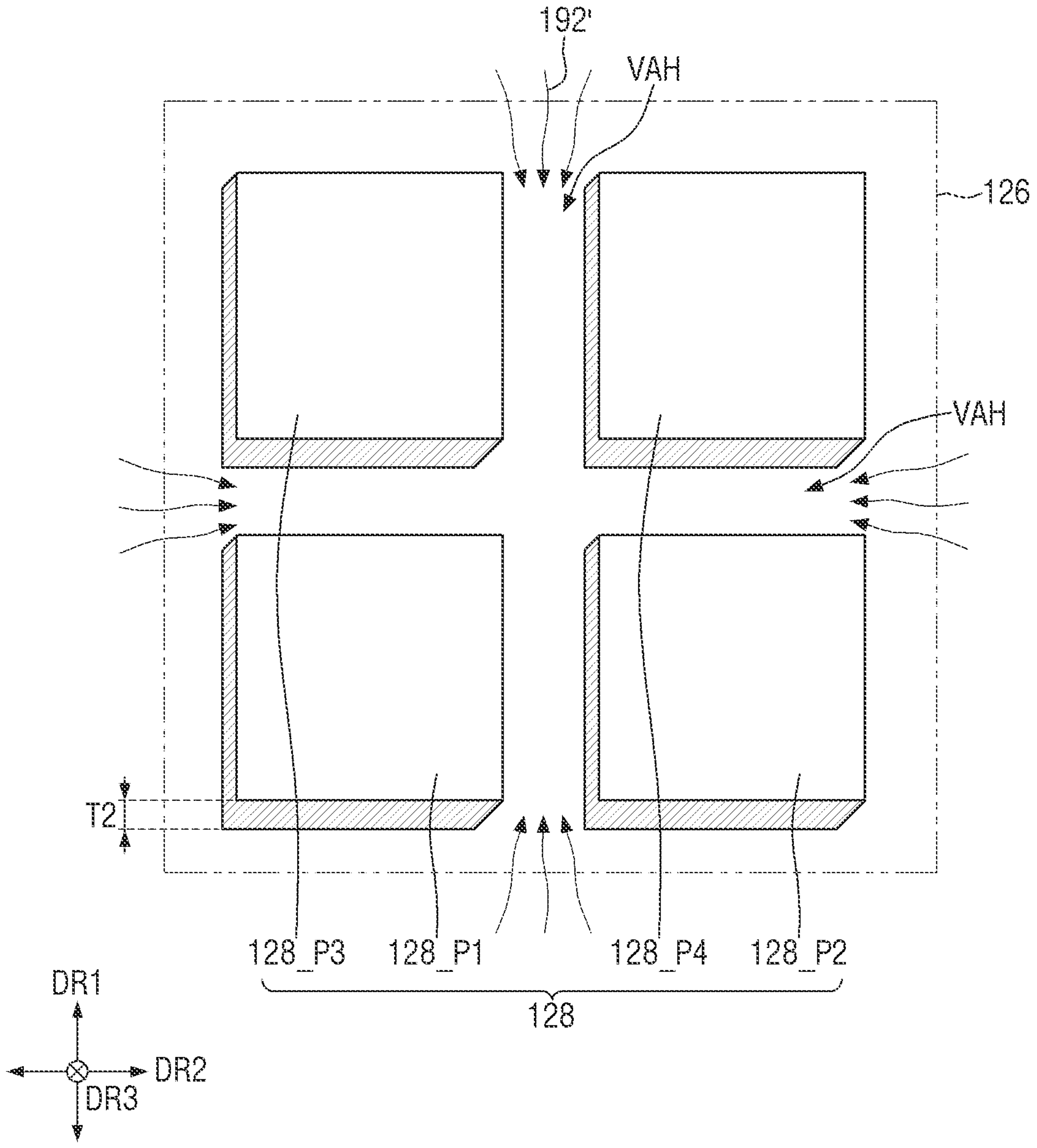
FIG. 12 is a diagram showing the spreadability of an organic material in valley holes according to some embodiments of the present disclosure.
Figure 13:
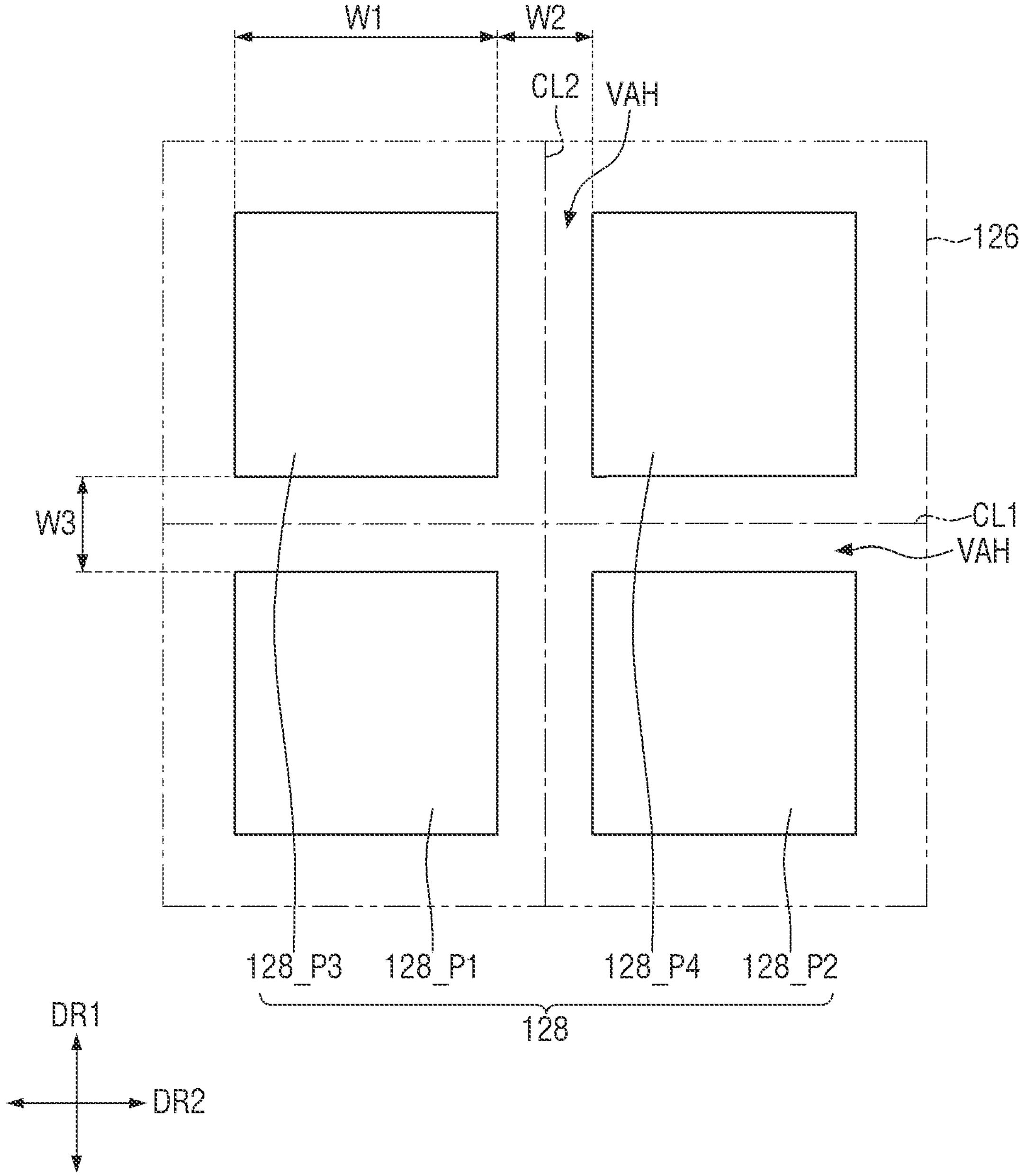
FIG. 13 is a plan view of the protrusion of FIG. 12.
Figure 14:
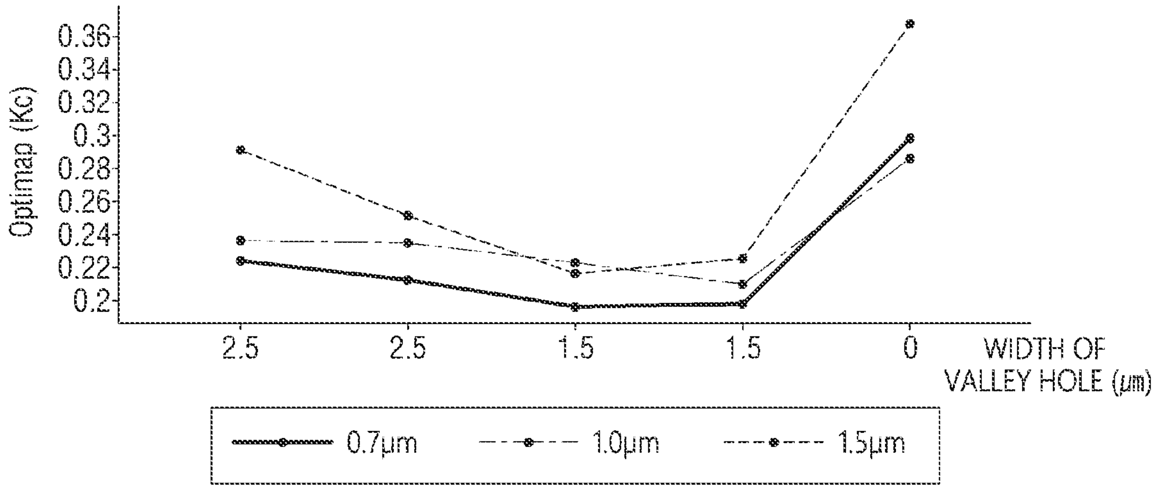
FIG. 14 is a graph showing curvature values depending on the thickness of a protrusion pattern and the width of a valley hole.

FIG. 12 is a diagram showing the spreadability of an organic material in valley holes according to some embodiments of the present disclosure. FIG. 13 is a plan view of the protrusion of FIG. 12. FIG. 14 is a graph showing curvature values depending on the thickness of a protrusion pattern and the width of a valley hole.

Referring to FIGS. 12 to 13, the protrusion 128 may include a first protrusion pattern 128_P1, a second protrusion pattern 128_P2, a third protrusion pattern 128_P3, and a fourth protrusion pattern 128_P4. The protrusion 128 may have a generally quadrangular shape when viewed from the top. As used herein, the shape of the protrusion when viewed from the top refers to a shape formed by an outline connecting the outer edges of all protrusion patterns of the protrusion 128. The shape of the protrusion 128 of FIG. 13 when viewed from the top may be a square or rectangular shape.

In FIGS. 12 and 13, two valley holes VAH of the protrusion patterns 128_P1 to 128_P4 are defined. One valley hole VAH may be extended along a second extension line CL2 extended in the second direction DR2, and the other valley hole VAH may be extended along a first extension line CL1 in the first direction DR1. The shape of each of the protrusion patterns 128_P1 to 128_P4 may be a square or a rectangle.

The first protrusion pattern 128_P1 and the second protrusion pattern 128_P2 may be symmetrical, and the third protrusion pattern 128_P3 and the fourth protrusion pattern 128_P4 may be symmetrical with respect to the second extension line CL2. The first protrusion pattern 128_P1 and the third protrusion pattern 128_P3 may be symmetrical, and the second protrusion pattern 128_P2 and the fourth protrusion pattern 128_P4 may be symmetrical with respect to the first extension line CL1. Each of the protrusion patterns 128_P1 to 128_P4 may have a first width W1, one of the valley holes VAH may have a second width W2, and the other one of the valley holes VAH may have a third width W3. According to some embodiments of the present disclosure, the first width W1 may be greater than the second width W2 and the third width W3, and the second width W2 may be equal to the third width W3.

The organic material 192' of the organic film 192 can spread more evenly on the first inorganic film 192 as the widths W2 and W3 of the valley holes VAH are smaller and the second thickness T2 is smaller. On the first inorganic film 191, the organic material 192' of the organic film 192 can spread by the capillary pressure generated by surface tension with the adjacent protrusion patterns 128_P1 to 128_P4 between the valley holes VAH. As described above, when the widths W2 and W3 of the valley holes VAH are smaller than the first width W1 and the second thickness T2 is equal to or less than 1.2 μm, the capillary pressure becomes larger and thus the organic material 192' can spread more evenly.

Referring to FIG. 14, the horizontal axis represents the width of valley holes W2 and W3 (see FIG. 13) measured in ram, and the vertical axis represents the surface measurement parameter related to the spreadability of the organic film 192, which is measured with an Optimap™ PSD from Rhopoint Instruments in unit of Kc. The larger the surface measurement parameter Optimap (Kc) is, the larger the standard deviation of the curvature of the surface of the organic film 192. The smaller the standard deviation of the curvature of the surface of the organic film 192 is, the better the spreadability of the surface of the organic film 192 is.

As shown in FIG. 14, it can be seen that when the thickness of the protrusion pattern was 0.7 μm, 1.0 μm and 1.5 μm, the surface measurement parameters Optimap (Kc) decreased as the width of the valley hole decreased from 2.5 μm to 1.5 μm. In addition, it can be seen that the surface measurement parameter Optimap (Kc) increased as the width of the valley hole decreased from 1.5 μm to 0 μm. Furthermore, it can be seen that the surface measurement parameter Optimap (Kc) when the thickness of the protrusion pattern is 0.7 μm and 1.0 μm was generally smaller than that when the thickness is 1.5 μm, and the surface measurement parameter Optimap (Kc) when the thickness of the protrusion pattern was 0.7 μm was generally smaller than that when the thickness is 1.0 μm.

Hereinafter, a method of fabricating a display device according to some embodiments of the present disclosure will be described.

Figure 15:
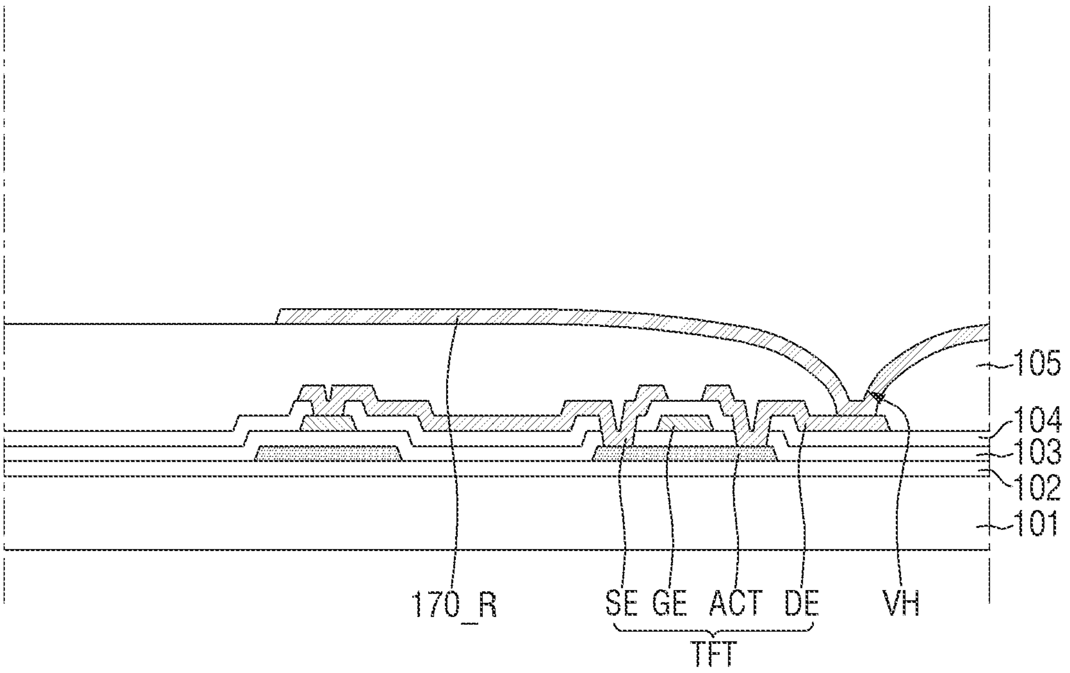
FIG. 15 is a cross-sectional view showing a processing step of a method of fabricating a display device according to some embodiments of the present disclosure.

FIG. 15 is a cross-sectional view showing a processing step of a method of fabricating a display device according to some embodiments of the present disclosure. A method of fabricating the elements between the anode electrode 170 and the substrate 101 of the display device of FIG. 9, a method of forming the touch member, and a method of forming the color filter layer are well known in the art; and, therefore, some redundant description thereof may be omitted.

Referring to FIGS. 9 and 15, a method of fabricating a display device according to some embodiments of the present disclosure may include arranging an anode electrode 170_R located on a substrate 101; forming a bank layer 126 including an opening OP exposing the anode electrode 170_R on the substrate 101 and a spacer 127 having a first thickness T1 on the bank layer 126; forming a protrusions 128 located on the bank layer 126 and spaced apart from the spacer 127 and having a second thickness T2 smaller than the first thickness T1; forming or arranging an emissive layer on the anode electrode 170_R exposed by the bank layer 126; forming or arranging a cathode electrode 180 on the emissive layer; and forming or arranging a thin-film encapsulation layer 190 on the cathode electrode 180.

In the method of fabricating the display device according to some embodiments, the spacer 127 and the protrusion 128 may be formed together. For example, the bank layer 126, the spacer 127 and the protrusion 128 may be simultaneously (or concurrently) formed using a half tone mask. In this instance, the bank layer 126, the spacer 127 and the protrusion 128 may include the same material.

Figure 16:
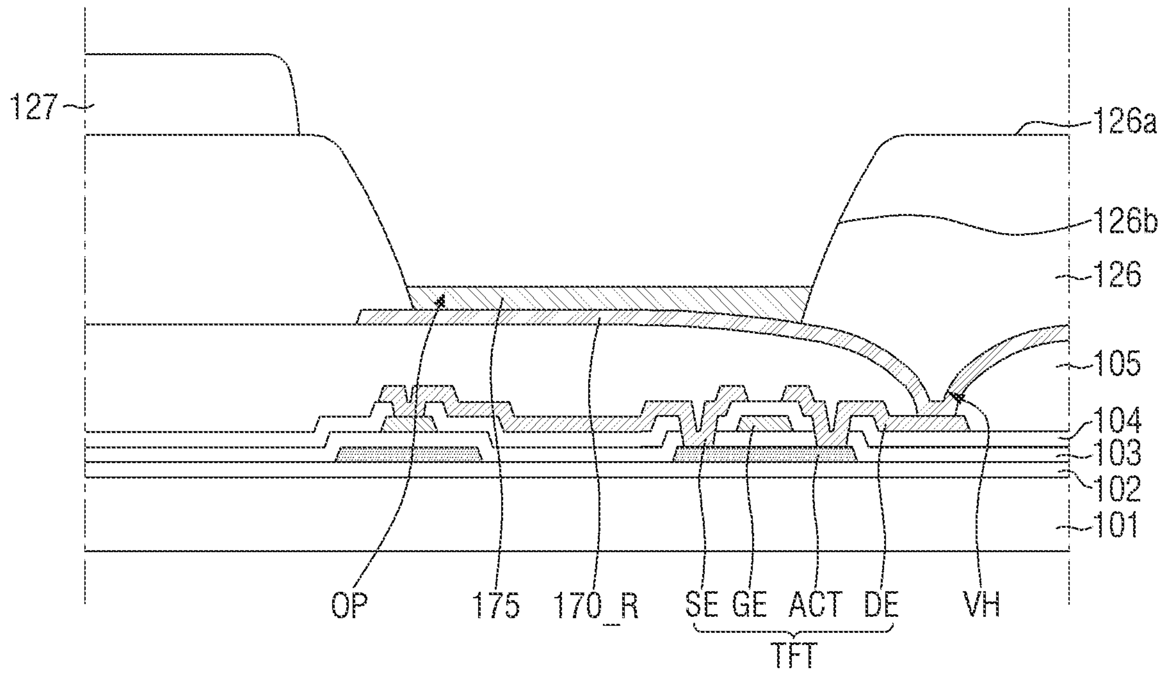
FIG. 16 is a cross-sectional view showing a processing step of a method of fabricating a display device according to some embodiments of the present disclosure.

FIG. 16 is a cross-sectional view showing a processing step of a method of fabricating a display device according to according to some embodiments of the present disclosure.

As shown in FIG. 16, a spacer 127 and a bank layer 126 are formed together, while a protrusion 128 may be formed via a separate process after the spacer 127 and the bank layer 126 have been formed. In this instance, the bank layer 126, the spacer 127 and the protrusion 128 may include the same material, but the present disclosure is not limited thereto. The bank layer 126 and the spacer 127 may include the same material while the protrusion 128 and the spacer 127 may include different materials.

Hereinafter, display devices according to some embodiments of the present disclosure will be described in more detail.

Figure 17:
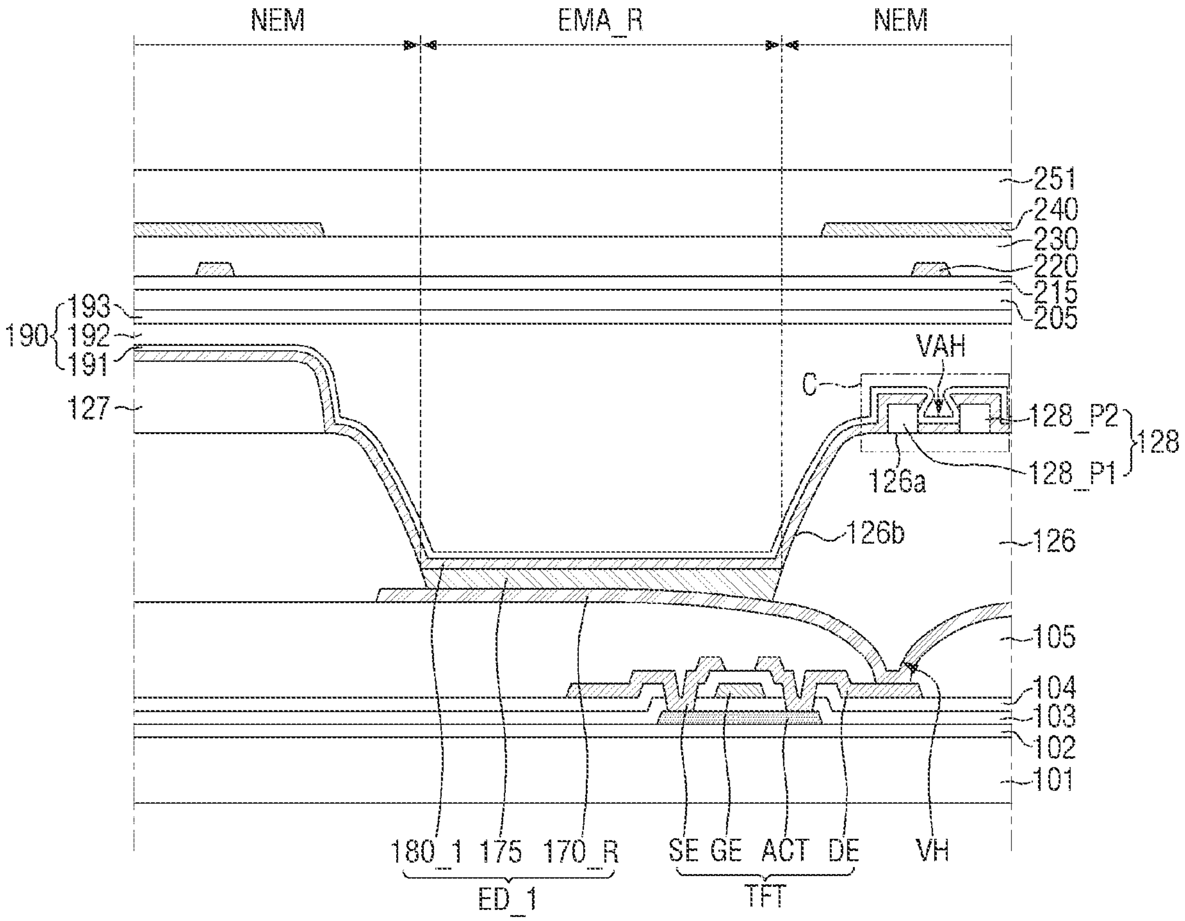
FIG. 17 is a cross-sectional view of a display device according to some embodiments of the present disclosure.
Figure 18:
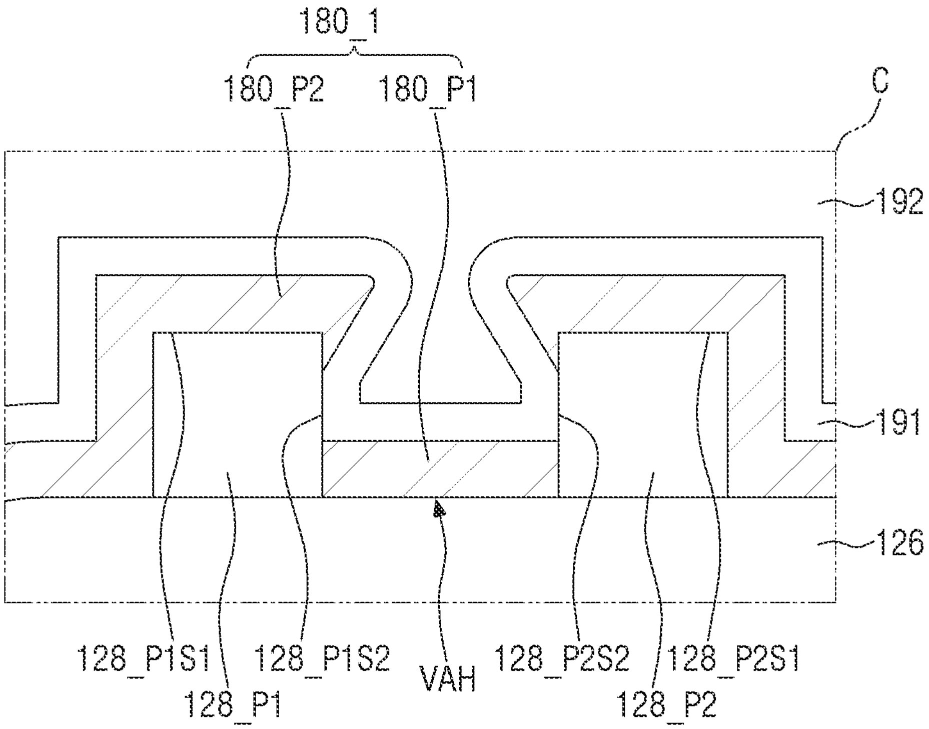
FIG. 18 is an enlarged, cross-sectional view of area C of FIG. 17.

FIG. 17 is a cross-sectional view of a display device according to some embodiments of the present disclosure. FIG. 18 is an enlarged, cross-sectional view of area C of FIG. 17.

A display device according to the embodiments described with respect to FIGS. 17 and 18 is different from the display device according to the embodiments described with respect to FIG. 9 in that a main pattern 180_P2 of a cathode electrode 180_1 completely covers a first upper surface 128_P1S1 and a second upper surface 128_P2S1, while a sub-pattern 180_P1 partially covers a first side surface 128_P1S2 and a second side surface 128_P2S2.

For example, the main pattern 180_P2 and the sub-pattern 180_P1 of the cathode electrode 180_1 may be disconnected. The main pattern 180_P2 may expose the lower portions of the first side surface 128_P1S2 and the second side surface 128_P2S2.

Figure 19:
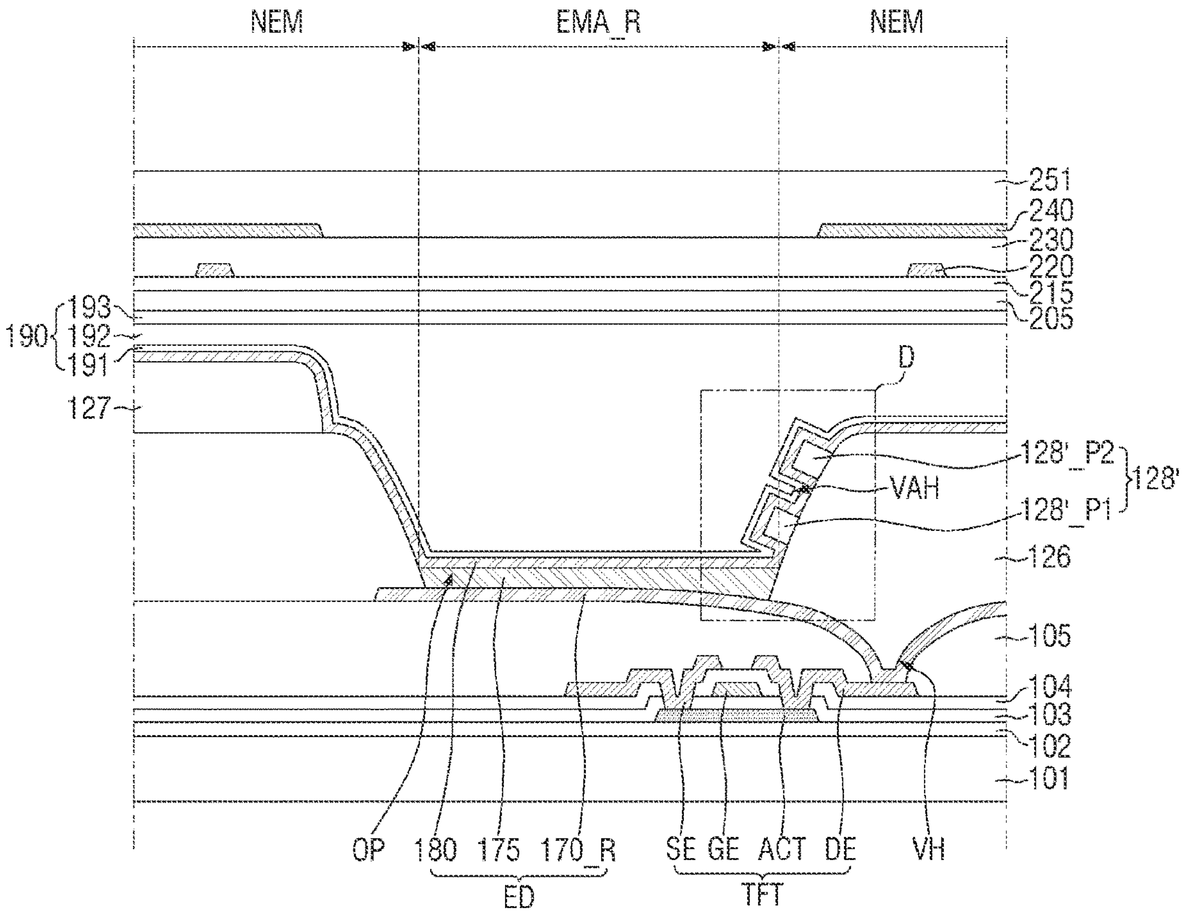
FIG. 19 is a cross-sectional view of a display device according to some embodiments of the present disclosure.
Figure 20:
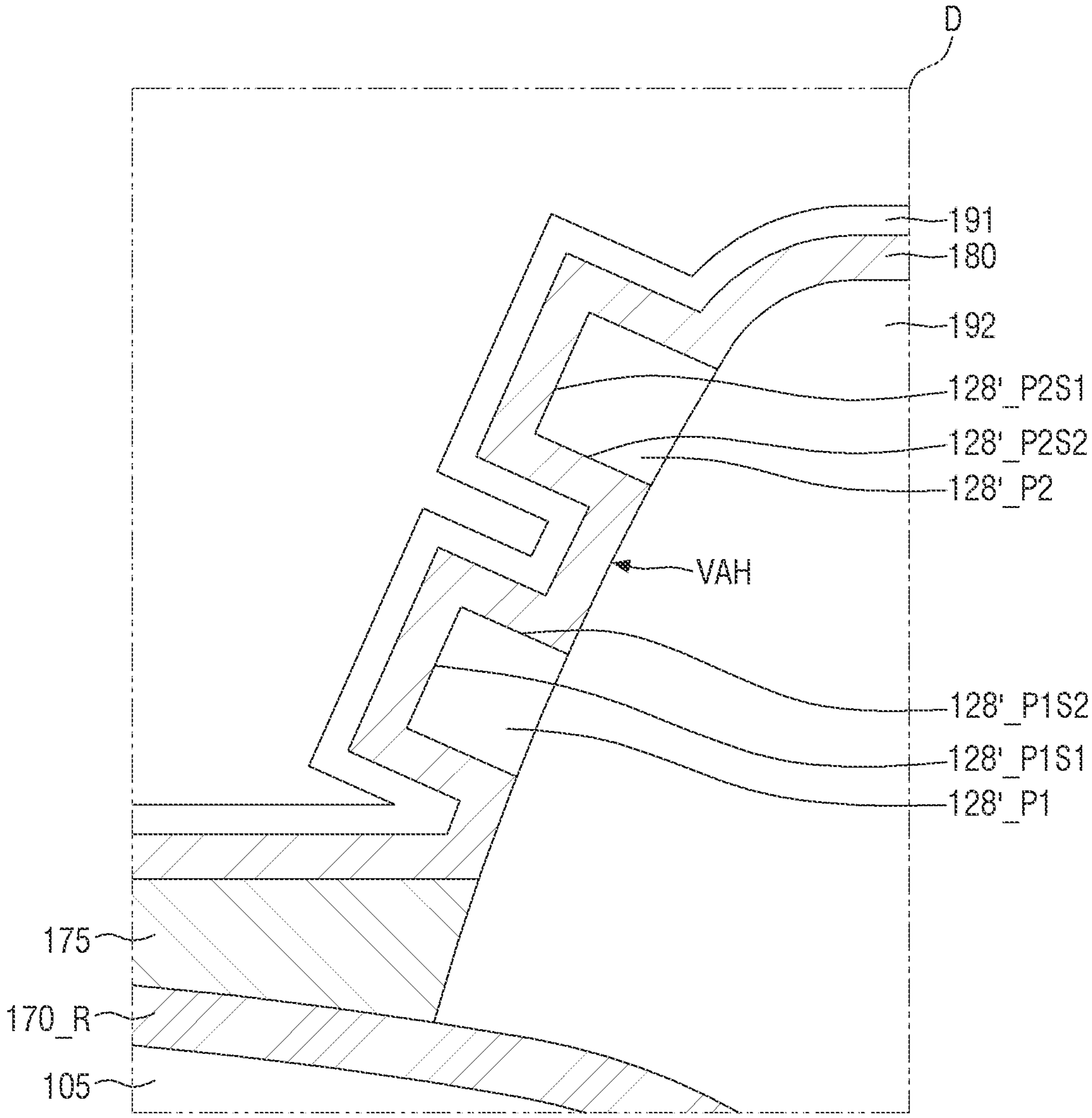
FIG. 20 is an enlarged cross-sectional view of area D of FIG. 19.

FIG. 19 is a cross-sectional view of a display device according to some embodiments of the present disclosure. FIG. 20 is an enlarged cross-sectional view of area D of FIG. 19.

A display device according to the embodiments described with respect to FIGS. 19 and 20 is different from the display device described with respect to FIG. 9 in that a protrusion 128' is arranged directly on a side surface of the bank layer 126, and a valley hole VAH exposes the side surface of the bank layer 126.

According to some embodiments, the protrusion 128' may be formed on the side surface of the bank layer 126. According to some embodiments, unlike that shown, the protrusion 128' may not overlap with the emissive layer in the thickness direction.

According to some embodiments, the organic material 192' of the organic film 192 can spread more evenly on the first inorganic film 192 as the widths W2 and W3 of the valley holes VAH are smaller and the first thickness T1 is smaller. On the first inorganic film 191, the organic material 192' of the organic film 192 can spread by the capillary pressure generated by surface tension with the adjacent protrusion patterns 128_P1 to 128_P4 between the valley holes VAH. As described above, when the widths W2 and W3 of the valley holes VAH are smaller than the first width W1 and the first thickness T1 is equal to or less than 1.2 μm, the capillary pressure becomes larger and thus the organic material 192' can spread more evenly.

Figure 21:
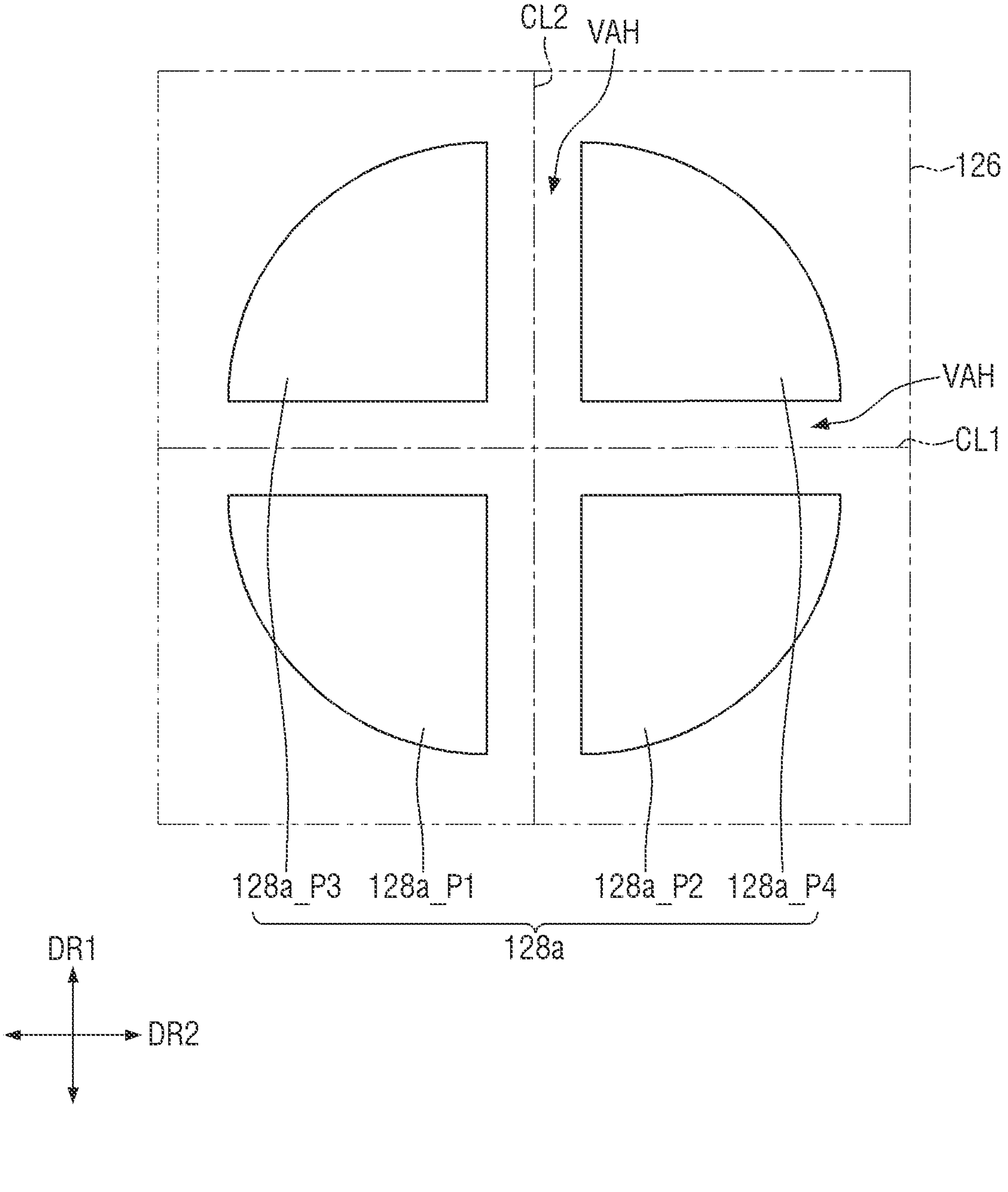
FIG. 21 is a plan view of a protrusion according to some embodiments of the present disclosure.

FIG. 21 is a plan view of a protrusion according to some embodiments of the present disclosure.

A protrusion 128*a* according to the embodiments described with respect to FIG. 21 is different from the protrusion 128 according to the embodiments described with respect to FIG. 13 in that the former has a generally circular shape when viewed from the top.

When the shape of the protrusion 128*a* has a generally circular shape according to some embodiments, the spreadability of the organic material 192' can be further improved compared to that of the organic material 192' (see FIG. 12) of the organic film 192 (see FIG. 9) which has a quadrangular shape when viewed from the top. Because the positional relationship between the protrusion patterns 128*a*_P1 to 128*a*_P4 of the protrusion 128*a* is the same as the positional relationship between the protrusion patterns 128_P1 to 128_P4 of the protrusion 128; and, therefore, some redundant description thereof may be omitted.

Figure 22:
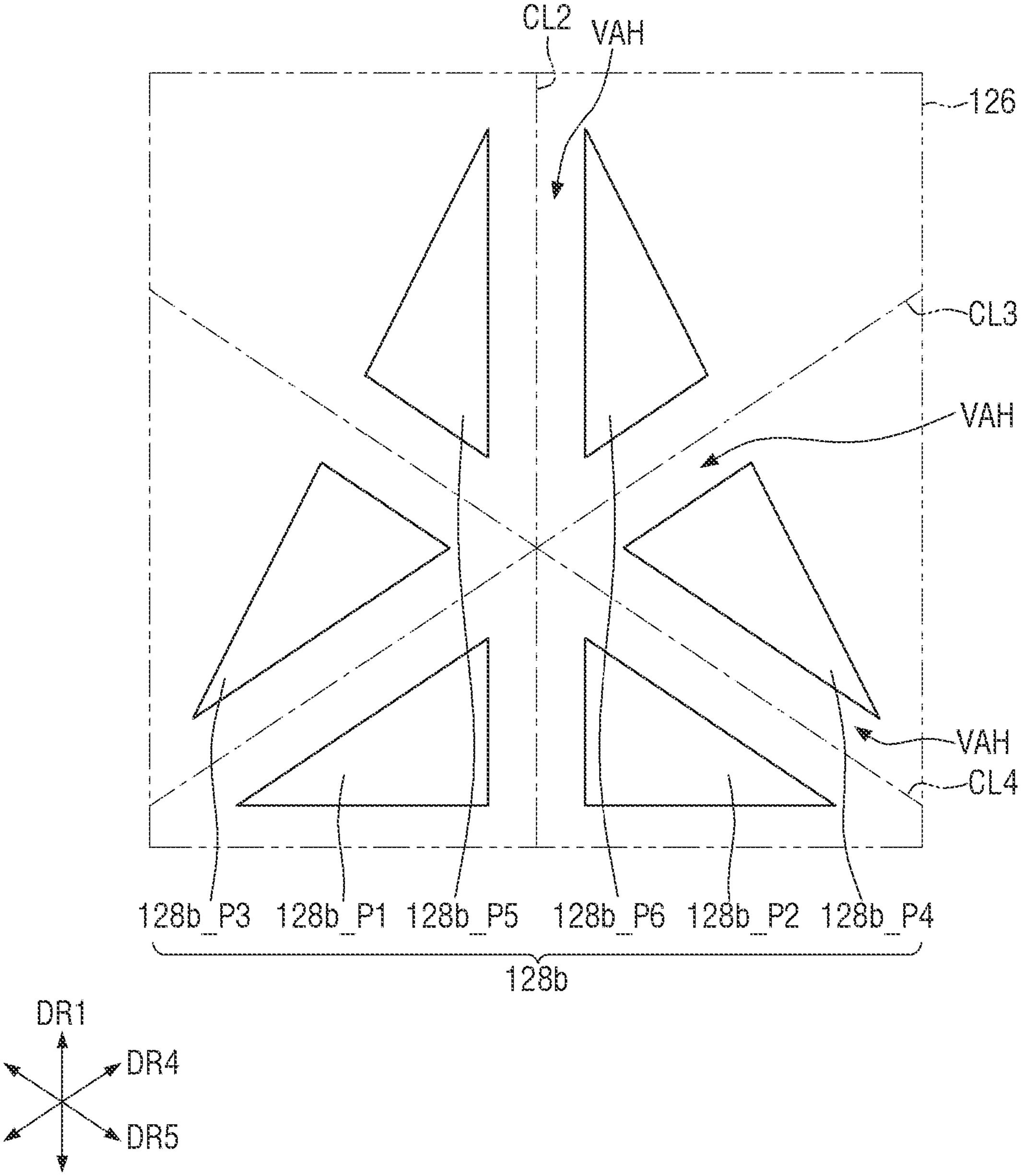
FIG. 22 is a plan view of a protrusion according to some embodiments of the present disclosure.

FIG. 22 is a plan view of a protrusion according to some embodiments of the present disclosure.

A protrusion 128*b* of FIG. 22 is different from the protrusion 128 of FIG. 12 in that a first extension line CL1 is eliminated and the third and fourth extension lines CL3 and CL4 are further defined.

That is to say, three valley holes VAH may be defined in the protrusion 128*b*. One valley hole VAH may be extended along the second extension line CL2, another valley hole VAH may be extended along a fourth direction DR4, and the other valley hole VAH may be extended along a fifth direction DR5. The angle between the first direction DR1 and the fourth direction DR4 may be 60 degrees, and the angle between the fourth direction DR4 and the fifth direction DR5 may be 60 degrees. According to some embodiments of the present disclosure, the protrusion 128*b* may be a generally triangular or equilateral triangular shape when viewed from the top.

A first protrusion pattern 128*b*_P1 and a second protrusion pattern 128*b*_P2, the third protrusion pattern 128*b*_P3 and the fourth protrusion pattern 128*b*_P4, and the fifth protrusion pattern 128*b*_P5 and the sixth protrusion pattern 128*b*_P6 may be symmetrical with respect to a second extension line CL2, the first protrusion pattern 128*b*_P1 and the third protrusion pattern 128*b*_P3, the second protrusion pattern 128*b*_P2 and the fifth protrusion pattern 128*b*_P5, and the fourth protrusion pattern 128*b*_P4 and the sixth protrusion pattern 128*b*_P6 may be symmetrical with respect to a third extension line CL3, and the second protrusion pattern 128*b*_P2 and the fourth protrusion pattern 128*b*_P4, the first protrusion pattern 128*b*_P1 and the sixth protrusion pattern 128*b*_P6, and the third protrusion pattern 128*b*_P3 and the fifth protrusion pattern 128*b*_P5 may be symmetrical with respect to a fourth extension line CL4.

Figure 23:
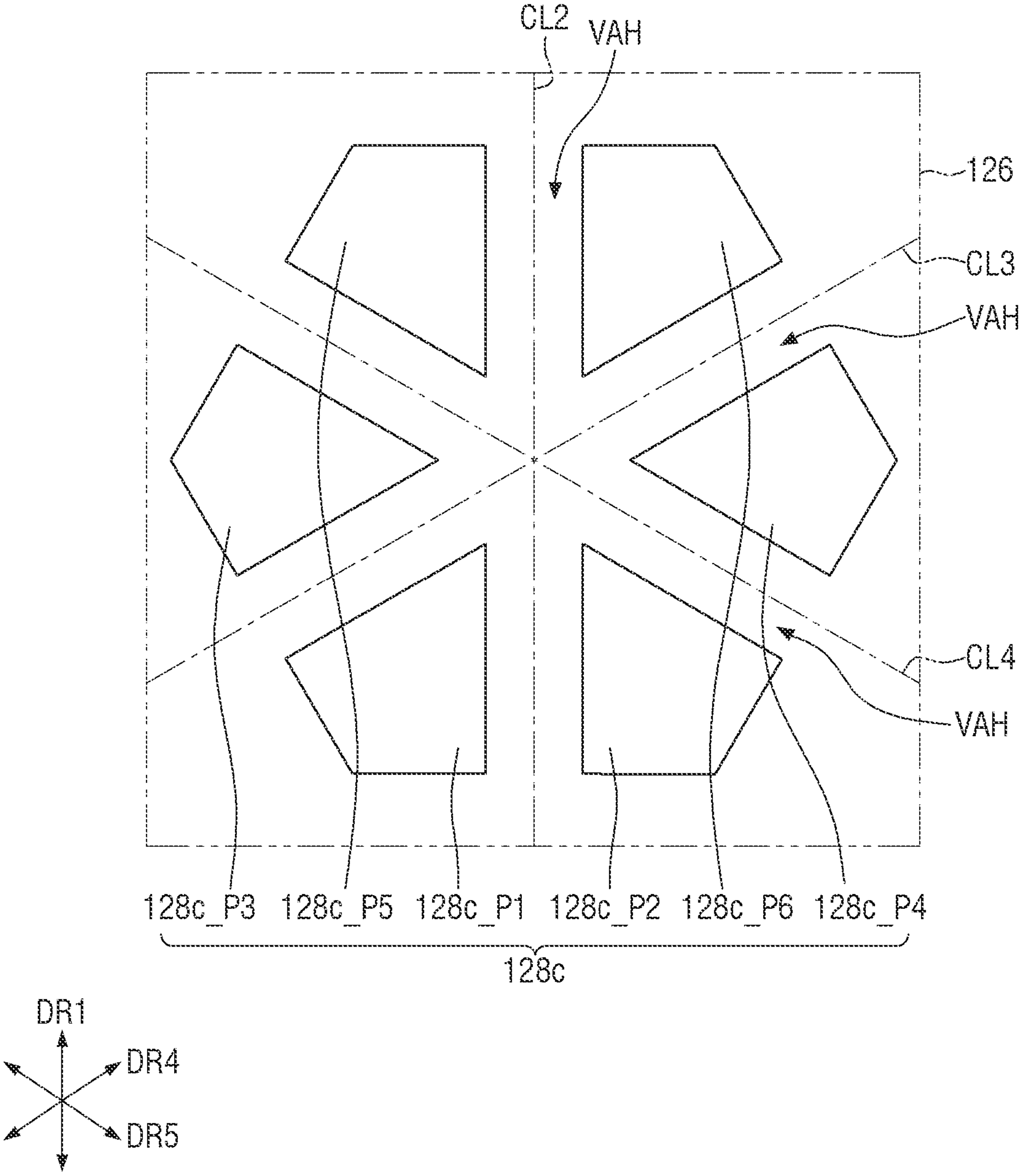
FIG. 23 is a plan view of a protrusion according to some embodiments of the present disclosure.

FIG. 23 is a plan view of a protrusion according to some embodiments of the present disclosure.

A protrusion 128*c* according to embodiments described with respect to FIG. 23 is different from the protrusion 128*b* according to the embodiments described with respect to FIG. 22 in that the former has a generally hexagonal shape when viewed from the top.

A first protrusion pattern 128*c*_P1 and a second protrusion pattern 128*c*_P2, the third protrusion pattern 128*c*_P3 and the fourth protrusion pattern 128*c*_P4, and the fifth protrusion pattern 128*c*_P5 and the sixth protrusion pattern 128*c*_P6 may be symmetrical with respect to a second extension line CL2, the first protrusion pattern 128*c*_P1 and the third protrusion pattern 128*c*_P3, the second protrusion pattern 128*c*_P2 and the fifth protrusion pattern 128*c*_P5, and the fourth protrusion pattern 128*c*_P4 and the sixth protrusion pattern 128*c*_P6 may be symmetrical with respect to a third extension line CL3, and the second protrusion pattern 128*c*_P2 and the fourth protrusion pattern 128*c*_P4, the first protrusion pattern 128*c*_P1 and the sixth protrusion pattern 128*c*_P6, and the third protrusion pattern 128*c*_P3 and the fifth protrusion pattern 128*c*_P5 may be symmetrical with respect to a fourth extension line CL4.

Figure 24:
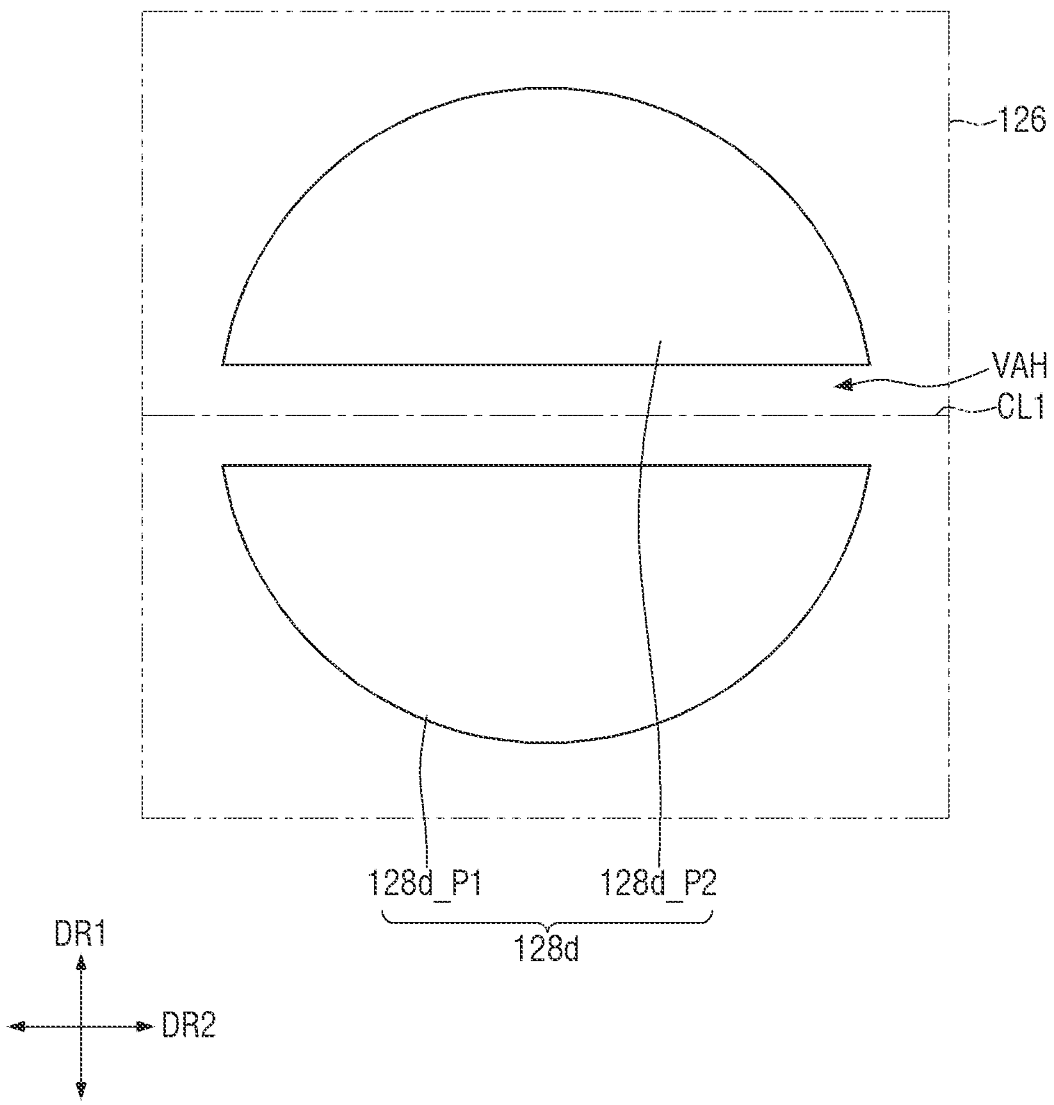
FIG. 24 is a plan view of a protrusion according to some embodiments of the present disclosure.

FIG. 24 is a plan view of a protrusion according to some embodiments of the present disclosure.

A protrusion 128*d* according to embodiments described with respect to FIG. 24 is different from the protrusion 128*a* according to embodiments described with respect to FIG. 21 in that there is one valley hole VAH.

The valley hole VAH may be extended along a first extension line CL1.

A first protrusion pattern 128*d*_P1 and a second protrusion pattern 128*d*_P2 of the protrusion 128*d* may be symmetrical with respect to the valley hole VAH.

Figure 25:
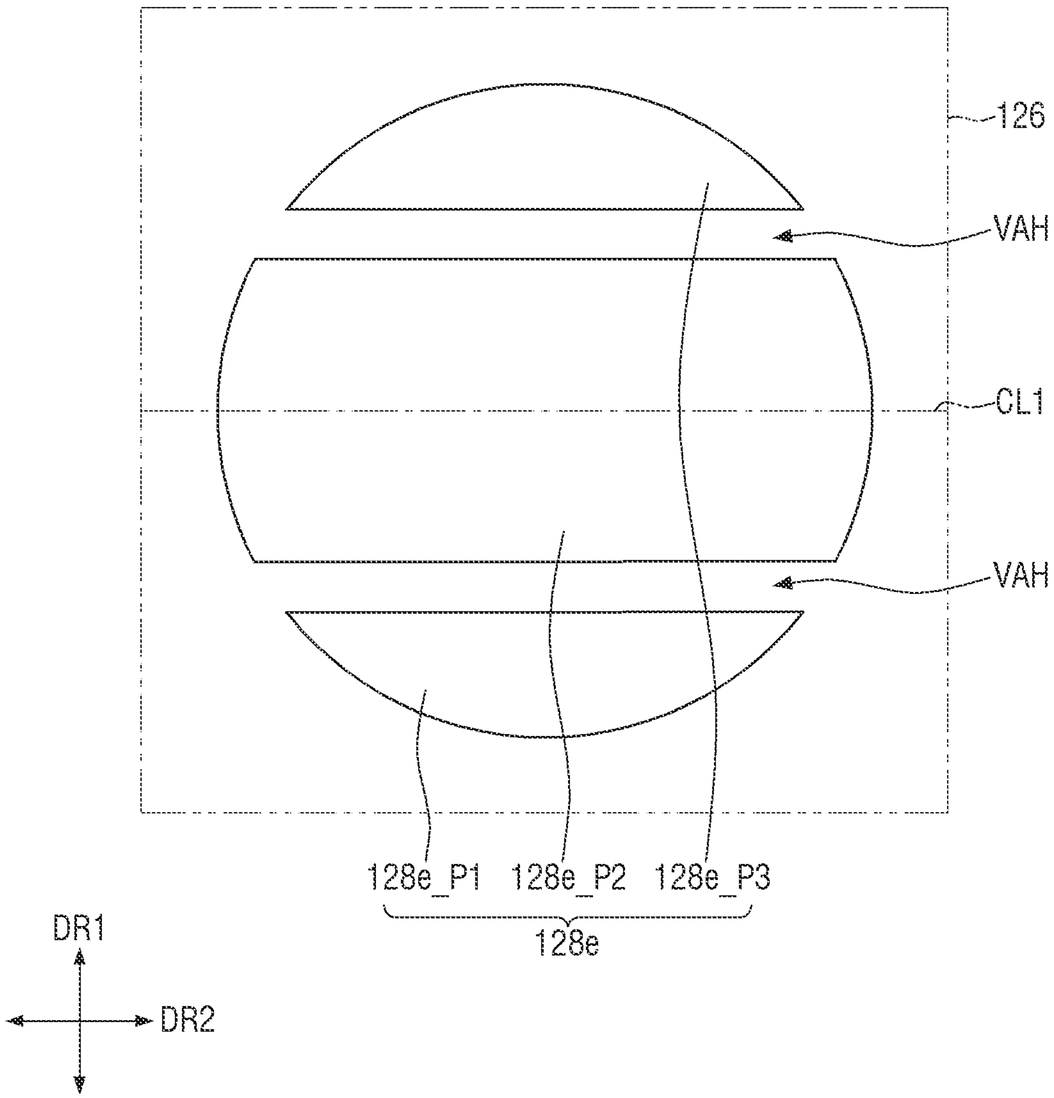
FIG. 25 is a plan view of a protrusion according to some embodiments of the present disclosure.

FIG. 25 is a plan view of a protrusion according to some embodiments of the present disclosure.

A protrusion 128*e* according to the embodiments described with respect to FIG. 25 is different from the protrusion 128*a* according to described with respect to FIG. 21 in that there are two valley holes VAH and the two valley holes VAH are extended in the same direction.

Each of the valley holes VAH may be extended in the second direction DR2.

A first protrusion pattern 128*e*_P1 and a second protrusion pattern 128*e*_P2 of the protrusion 128*e* may be symmetrical with respect to a first extension line CL1.

Figure 26:
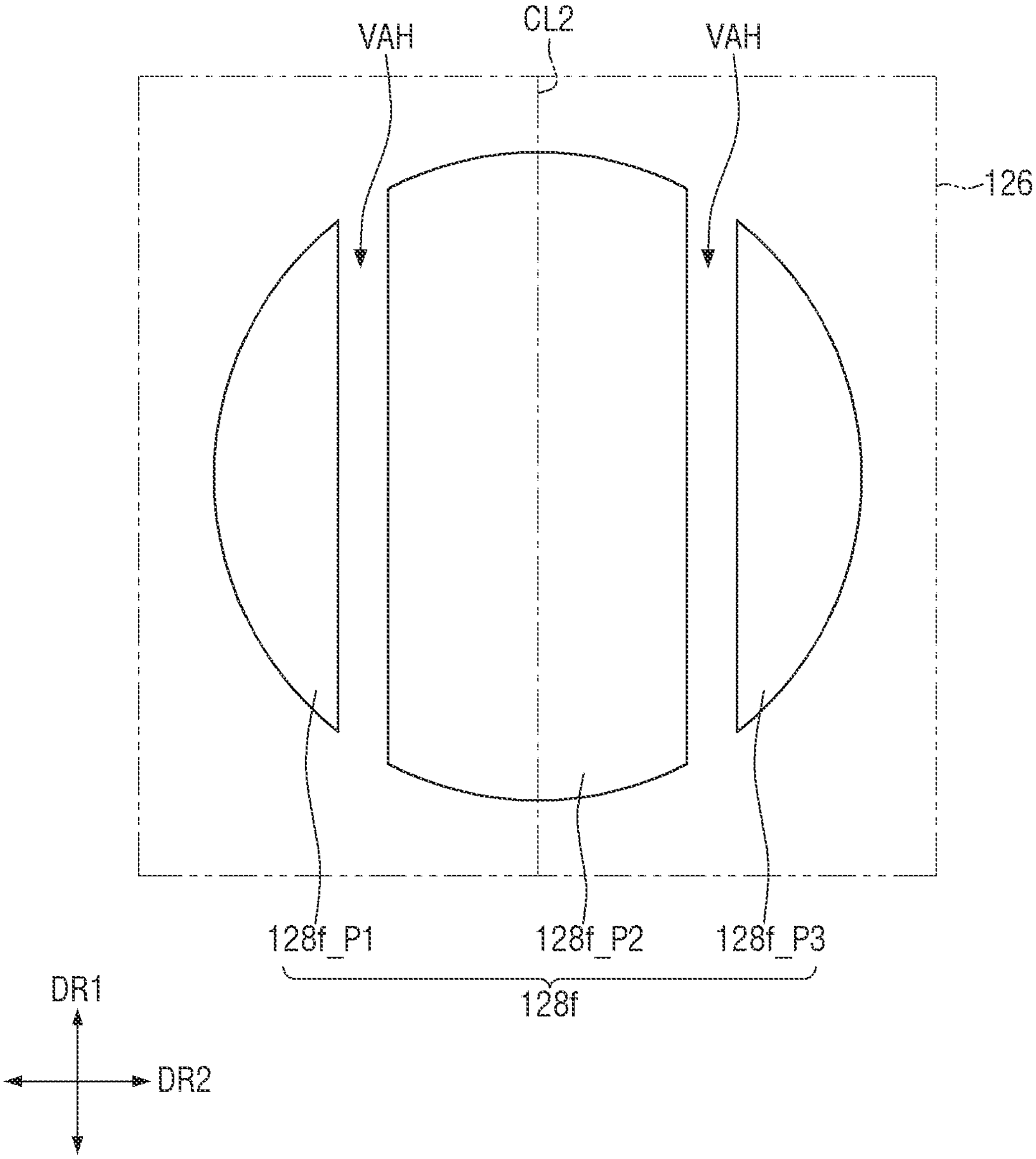
FIG. 26 is a plan view of a protrusion according to some embodiments of the present disclosure.

FIG. 26 is a plan view of a protrusion according to some embodiments of the present disclosure.

A protrusion 128*f* according to the embodiments described with respect to FIG. 26 is different from the protrusion 128*e* according to the embodiments described with respect to FIG. 25 in that there are two valley holes VAH and the two valley holes VAH are extended in the first direction DR1.

Each of the valley holes VAH may be extended in the first direction DR1.

A first protrusion pattern 128*f*_P1 and a second protrusion pattern 128*f*_P2 of the protrusion 128*f* may be symmetrical with respect to a second extension line CL2.

Although aspects of some embodiments of the invention have been disclosed for illustrative purposes, those skilled in the art will appreciate that various modifications, additions and substitutions are possible, without departing from the scope and spirit of the invention as disclosed in the accompanying claims, and their equivalents.

What is claimed is:

1. A display device comprising:

a substrate;

a first electrode on the substrate;

a bank layer on the substrate and comprising an opening exposing the first electrode;

a spacer on the bank layer and having a first thickness in a direction perpendicular to a top surface of the substrate, the first thickness being a first distance between a lower surface of the spacer in contact with the bank layer and an upper surface of the spacer;

a protrusion on the bank layer, spaced apart from the spacer, and having a second thickness in the direction perpendicular to the top surface of the substrate that is less than the first thickness in the direction perpendicular to the top surface of the substrate, the second thickness being a second distance between a lower surface of the protrusion in contact with the bank layer and an upper surface of the protrusion; and an emissive layer on the first electrode exposed by the bank layer, wherein the protrusion comprises a first protrusion pattern and a second protrusion pattern spaced apart from the first protrusion pattern with a valley hole therebetween, and wherein the first protrusion pattern, the second protrusion pattern, and the valley hole each have a width in one direction, and a sum of the width of the first protrusion pattern, the width of the second protrusion pattern, and the width of the valley hole in the one direction is less than a width of the opening.

2. The display device of claim 1, wherein the spacer is directly on an upper surface of the bank layer, and wherein the protrusion is directly on the upper surface of the bank layer, and the valley hole exposes the upper surface of the bank layer.

3. The display device of claim 2, further comprising:

a second electrode on the emissive layer, wherein the first protrusion pattern comprises a first upper surface, and a first side surface facing the second protrusion pattern, wherein the second protrusion pattern comprises a second upper surface, and a second side surface facing the first protrusion pattern, and wherein the second electrode completely covers the first upper surface, the first side surface, the second upper surface, and the second side surface.

4. The display device of claim 3, wherein the second electrode is formed conformally to level differences created by the first protrusion pattern and the second protrusion pattern.

5. The display device of claim 3, further comprising:

an encapsulation layer on the second electrode, wherein the encapsulation layer comprises a first inorganic film on the second electrode, an organic film on the first inorganic film, and a second inorganic film on the organic film, and wherein the first inorganic film completely covers the first upper surface, the first side surface, the second upper surface, and the second side surface.

6. The display device of claim 5, wherein the first inorganic film is formed conformally to level differences created by the first protrusion pattern and the second protrusion pattern.

7. The display device of claim 6, wherein the valley hole is filled with the organic film.

8. The display device of claim 7, further comprising: a touch conductive layer directly on the encapsulation layer.

9. The display device of claim 8, wherein the touch conductive layer comprises a first touch conductive layer and a second touch conductive layer, and further comprises a first touch insulating layer between the first touch conductive layer and the second touch conductive layer, and wherein the first touch conductive layer is between the second inorganic film and the first touch insulating layer.

10. The display device of claim 9, further comprising:

a color filter layer on the touch conductive layer.

11. The display device of claim 2, wherein the bank layer comprises a same material as the spacer.

12. The display device of claim 11, wherein the protrusion comprises a same material as the bank layer.

13. The display device of claim 11, further comprising:

a second electrode on the emissive layer, wherein the first protrusion pattern comprises a first upper surface, and a first side surface facing the second protrusion pattern, wherein the second protrusion pattern comprises a second upper surface, and a second side surface facing the first protrusion pattern, and wherein the second electrode completely covers the first upper surface and the second upper surface, and partially covers the first side surface and the second side surface.

14. The display device of claim 13, wherein the second electrode exposes a lower portion of the first side surface and exposes a lower portion of the second side surface.

15. The display device of claim 1, wherein the spacer is directly on an upper surface of the bank layer, and wherein the protrusion is directly on a side surface of the bank layer, and the valley hole exposes the side surface of the bank layer.

16. A display device comprising:

a substrate;

a first electrode on the substrate;

a bank layer on the substrate and comprising an opening exposing the first electrode;

a spacer on the bank layer and a protrusion spaced apart from the spacer;

an emissive layer on the first electrode exposed by the bank layer;

a second electrode on the emissive layer; and an encapsulation layer on the second electrode, wherein the protrusion comprises a first protrusion pattern having a first width, and a second protrusion pattern having a second width and spaced apart from the first protrusion pattern with a valley hole therebetween, wherein the encapsulation layer comprises a first inorganic film on the second electrode, an organic film on the first inorganic film, and a second inorganic film on the organic film, wherein the first protrusion pattern comprises a first upper surface, and a first side surface facing the second protrusion pattern, wherein the second protrusion pattern comprises a second upper surface, and a second side surface facing the first protrusion pattern, wherein each of the second electrode and the first inorganic film covers the first upper surface, the first side surface, the second upper surface and the second side surface, wherein the valley hole is filled with the organic film, wherein the valley hole has a third width, and wherein the first width and the second width are greater than the third width.

17. The display device of claim 16, wherein the protrusion has a circular shape in a plan view.

18. The display device of claim 16, wherein the valley hole extends in a first direction, and wherein the first protrusion pattern and the second protrusion pattern are symmetrical with respect to the valley hole.

19. The display device of claim 16, further comprising:

a touch conductive layer directly on the encapsulation layer, wherein the touch conductive layer comprises a first touch conductive layer and a second touch conductive layer, and further comprises a first touch insulating layer between the first touch conductive layer and the second touch conductive layer, and wherein the first touch conductive layer is between the second inorganic film and the first touch insulating layer.

20. An electronic device comprising:

a substrate;

a first electrode on the substrate;

a bank layer on the substrate and comprising an opening exposing the first electrode;

a protrusion on the bank layer having a first thickness; and an emissive layer on the first electrode exposed by the bank layer, wherein the protrusion comprises a first protrusion pattern and a second protrusion pattern spaced apart from the first protrusion pattern with a valley hole therebetween, wherein the first protrusion pattern and the second protrusion pattern each have a first width when viewed from top, and the valley hole has a second width in a plan view, wherein the second width is smaller than the first width, and wherein the first thickness is equal to or less than 1.2 micrometers (μm).

* * * * *